US 9,077,351 B2

(12) United States Patent
Park et al.

(10) Patent No.: US 9,077,351 B2
(45) Date of Patent: Jul. 7, 2015

(54) ALL-DIGITAL PHASE-LOCKED LOOP FOR ADAPTIVELY CONTROLLING CLOSED-LOOP BANDWIDTH, METHOD OF OPERATING THE SAME, AND DEVICES INCLUDING THE SAME

(71) Applicants: Jae Jin Park, Seongnam-si (KR); Tae Kwang Jang, Hwaseong-si (KR); Nan Xing, Seoul (KR); Jen Lung Liu, Seoul (KR)

(72) Inventors: Jae Jin Park, Seongnam-si (KR); Tae Kwang Jang, Hwaseong-si (KR); Nan Xing, Seoul (KR); Jen Lung Liu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/204,251

(22) Filed: Mar. 11, 2014

(65) Prior Publication Data

US 2014/0266346 A1    Sep. 18, 2014

(30) Foreign Application Priority Data

Mar. 13, 2013   (KR) .................. 10-2013-0026740
May 8, 2013     (KR) .................. 10-2013-0051824

(51) Int. Cl.
*H03L 7/06*     (2006.01)
*H03L 7/085*    (2006.01)

(52) U.S. Cl.
CPC ....................................... *H03L 7/085* (2013.01)

(58) Field of Classification Search
None
See application file for complete search history.

(56) References Cited

U.S. PATENT DOCUMENTS

| 5,056,118 | A | * | 10/1991 | Sun ................................ 375/342 |
| 5,511,100 | A | * | 4/1996 | Lundberg et al. ............. 375/376 |
| 5,956,379 | A | * | 9/1999 | Tarleton ......................... 375/376 |
| 6,259,755 | B1 | * | 7/2001 | O'Sullivan et al. ........... 375/376 |
| 6,480,047 | B2 | | 11/2002 | Abdel-Maguid et al. |
| 7,042,972 | B2 | * | 5/2006 | Fahim ............................ 375/376 |
| 7,177,611 | B2 | | 2/2007 | Goldman |
| 7,196,588 | B2 | | 3/2007 | Wang et al. |
| 7,212,073 | B2 | | 5/2007 | Youssoufian et al. |
| 7,327,197 | B2 | * | 2/2008 | Kriz ................................. 331/17 |
| 7,480,361 | B1 | * | 1/2009 | Zhang et al. .................. 375/376 |
| 7,676,014 | B2 | * | 3/2010 | Chen et al. .................... 375/376 |
| 7,750,701 | B2 | | 7/2010 | Ainspan et al. |
| 7,932,766 | B2 | | 4/2011 | Choi et al. |
| 7,999,586 | B2 | | 8/2011 | Lee et al. |
| 8,098,103 | B2 | | 1/2012 | Filipovic et al. |
| 8,106,714 | B2 | | 1/2012 | Oh et al. |
| 8,130,048 | B2 | | 3/2012 | Kobayashi |
| 8,138,840 | B2 | | 3/2012 | Ainspan et al. |
| 8,183,936 | B2 | | 5/2012 | Chen et al. |
| 8,203,369 | B2 | | 6/2012 | van de Beek |
| 8,212,610 | B2 | | 7/2012 | Bereza et al. |
| 2003/0107442 | A1 | | 6/2003 | Staszewski |
| 2005/0035800 | A1 | * | 2/2005 | Lee ................................. 327/158 |
| 2006/0267636 | A1 | * | 11/2006 | Lin ..................................... 327/3 |
| 2007/0296511 | A1 | | 12/2007 | Holuigue et al. |

(Continued)

FOREIGN PATENT DOCUMENTS

KR    1020090033783 A    4/2009

*Primary Examiner* — Cassandra Cox
(74) *Attorney, Agent, or Firm* — Sughrue Mion, PLLC

(57) ABSTRACT

A method of operating an all-digital phase-locked loop (AD-PLL) includes detecting a phase change in a feedback signal of the ADPLL using a search window and controlling a closed-loop bandwidth of the ADPLL based on a detection result. The closed-loop bandwidth when the phase change is detected outside the search window is greater than the closed-loop bandwidth when the phase change is detected within the search window.

28 Claims, 19 Drawing Sheets

(56) References Cited

U.S. PATENT DOCUMENTS

| | | |
|---|---|---|
| 2010/0013531 A1 | 1/2010 | Ainspan et al. |
| 2010/0283654 A1 | 11/2010 | Waheed et al. |
| 2011/0267122 A1 | 11/2011 | Jeong et al. |
| 2011/0279156 A1* | 11/2011 | Abbasi et al. ............... 327/158 |
| 2011/0309867 A1 | 12/2011 | Choi et al. |

* cited by examiner

ALL-DIGITAL PHASE-LOCKED LOOP FOR ADAPTIVELY CONTROLLING CLOSED-LOOP BANDWIDTH, METHOD OF OPERATING THE SAME, AND DEVICES INCLUDING THE SAME

CROSS-REFERENCE TO RELATED APPLICATIONS

This application claims priority from Korean Patent Application No. 10-2013-0026740 filed on Mar. 13, 2013, and Korean Patent Application No. 10-2013-0051824 filed on May 8, 2013, the disclosures of which are hereby incorporated by reference in their entirety.

BACKGROUND

1. Field

Methods, devices, and articles of manufacture consistent with the present disclosure relate to an all-digital phase-locked loop (ADPLL), and more particularly, to a digitally controlled oscillator (DCO) for adaptively controlling a closed-loop bandwidth according to whether a phase of a feedback signal of the ADPLL changes within a search window, the ADPLL including the DCO, and devices including the ADPLL.

2. Description of Related Art

A phase-locked loop (PLL) is a control circuit that generates an output clock signal having a phase related with a phase of an input clock signal. The PLL is widely used in wireless communication devices, computers, and other electronic devices.

SUMMARY

According to an aspect of an exemplary embodiment, there is provided a method of operating an all-digital phase-locked loop (ADPLL). The method includes detecting a phase change in a feedback signal of the ADPLL using a search window and controlling a closed-loop bandwidth of the ADPLL based on the detection result.

The closed-loop bandwidth when the phase change is detected outside the search window may be greater than the closed-loop bandwidth when the phase change is detected within the search window.

The method may further include comparing the feedback signal with a reference clock signal using a bangbang phase frequency detector. The closed-loop bandwidth may be controlled based on the detection result and a comparison result.

The closed-loop bandwidth when the phase change is detected outside the search window and the ADPLL is in an unlock state may be greater than the closed-loop bandwidth when the phase change is detected within the search window or the ADPLL is in a lock state.

The method may further include defining the search window using two reference clock signals related to an input clock signal.

According to an aspect of another exemplary embodiment, there is provided a method of operating a system on chip (SoC) including an ADPLL and a system. The method includes detecting whether a phase of a feedback signal of the ADPLL changes within a search window; controlling a closed-loop bandwidth of the ADPLL based on the detection result; and providing an output clock signal of the ADPLL, which is related to a controlled closed-loop bandwidth, for the system.

According to an aspect of another exemplary embodiment, there is provided an ADPLL including a reference clock signal generator configured to generate a plurality of reference clock signals, a detection circuit configured to detect whether a phase of a feedback signal of the ADPLL changes within a search window defined by two of the reference clock signals and to output a detection signal based on the detection result, and a closed-loop bandwidth adjustment circuit configured to control a closed-loop bandwidth of the ADPLL based on the detection signal.

The closed-loop bandwidth adjustment circuit may include a bangbang phase frequency detector configured to compare a phase and frequency of one of the reference clock signals with a phase and frequency of the feedback signal and to generate a comparison signal based on a result of the comparison, and a lock detector configured to determine a lock or unlock state of the ADPLL based on the comparison signal and to generate a lock signal indicating the lock or unlock state. The closed-loop bandwidth adjustment circuit may control the closed-loop bandwidth based on the detection signal and the lock signal.

The closed-loop bandwidth adjustment circuit may include an automatic frequency control circuit configured to compare a frequency of one of the reference clock signals with a frequency of the feedback signal and to generate a first control code and a second control code, and a digitally controlled oscillator configured to control a delay of delay cells related to the closed-loop bandwidth based on the first control code and to control a current of a current source related to the closed-loop bandwidth based on the second control code.

The closed-loop bandwidth adjustment circuit may further include a bangbang phase frequency detector configured to compare a phase and frequency of the one reference clock signal with a phase and frequency of the feedback signal and to generate a comparison signal based on a result of the comparison; a lock detector configured to determine a lock or unlock state of the ADPLL based on the comparison signal and to generate a lock signal indicating the lock or unlock state; and a fine control code generation circuit configured to generate a fine control code based on the detection signal, the comparison signal, and the lock signal. The digitally controlled oscillator may control a total capacitance of capacitors related to the closed-loop bandwidth based on the fine control code.

According to an aspect of another exemplary embodiment, there is provided a SoC including an ADPLL and an application processor configured to operate in response to a clock signal related with an output clock signal of the ADPLL. The ADPLL may include a reference clock signal generator configured to generate a plurality of reference clock signals, a detection circuit configured to detect whether a phase of a feedback signal of the ADPLL changes within a search window defined by two of the reference clock signals, and a closed-loop bandwidth adjustment circuit configured to control a closed-loop bandwidth of the ADPLL based on a detection result of the detection circuit.

According to an aspect of another exemplary embodiment, there is provided a portable electronic device including the SoC and a display configured to display data processed by the application processor.

BRIEF DESCRIPTION OF THE DRAWINGS

The above and other aspects will become more apparent by describing in detail exemplary embodiments with reference to the attached drawings in which.

DETAILED DESCRIPTION

Figure 1:
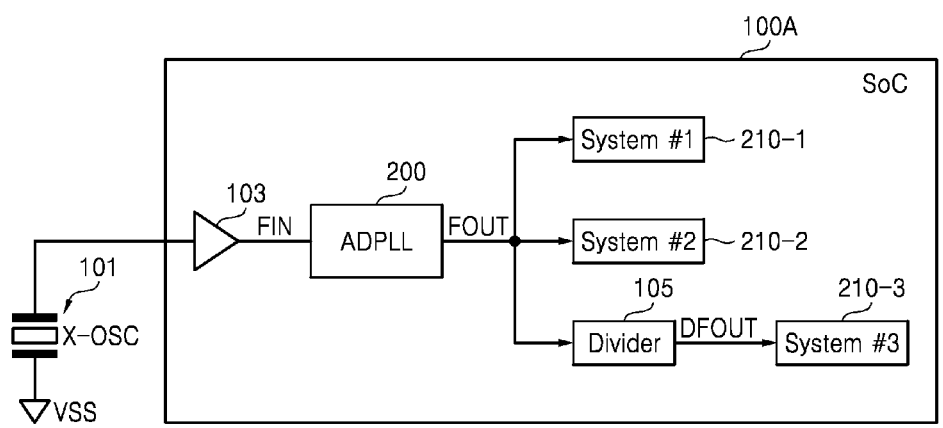
FIG. 1 is a block diagram of a system on chip (SoC) including an all-digital phase-locked loop (ADPLL) according to an exemplary embodiment.

Exemplary embodiments now will be described more fully hereinafter with reference to the accompanying drawings. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms "first", "second," etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system on chip (SoC) including an all-digital phase-locked loop (ADPLL), according to an exemplary embodiment. An SoC 100A includes a buffer 103, an ADPLL 200, a plurality of systems 210-1 through 210-3, and a divider 105.

The buffer 103 buffers an output signal of a crystal oscillator (X-OSC) 101 implemented outside the SoC 100A and generates an input clock signal FIN.

The ADPLL 200 may detect a phase change in a feedback signal of the ADPLL 200 using a search window, adjust the closed-loop bandwidth of the ADPLL 200, and generate an output clock signal FOUT based on the adjustment result.

In other words, the ADPLL 200 may control the closed-loop bandwidth of the ADPLL 200 according to whether there is a phase change in the feedback signal of the ADPLL 200 within the search window.

The systems 210-1 and 210-2 operate in response to the output clock signal FOUT. The divider 105 divides the output clock signal FOUT by a division factor and outputs a divided output clock signal DFOUT to the system 210-3.

The systems 210-1 through 210-3 are hardware or circuits that operate using the output clock signal FOUT or a clock signal related with the output clock signal FOUT.

For instance, the system 210-1 may be a central processing unit (CPU), a processor, or an application processor (AP); the system 210-2 may be a graphics processing unit (GPU); and the system 210-3 may be a memory device or a memory controller. However, the systems 210-1 to 210-3 are not particularly limited, and may include any hardware or circuits that operate using a clock signal.

The systems 210-1 through 210-3 each may be an intellectual property (IP). Here, an IP is a function block used in the SoC 100A and may be a CPU, a processor, a core in a multi-core processor, a memory device, a universal serial bus (USB), a peripheral component interconnect (PCI), a digital signal processor (DSP), a wired interface, a wireless interface, a controller, embedded software, a codec, a video module (such as a camera interface, a Joint Photographic Experts Group (JPEG) processor, a video processor, or a mixer, etc.), a three-dimensional (3D) graphics core, an audio system, or a driver, etc.

The SoC 100A may be a part of an AP or a part of a mobile AP.

Figure 2:
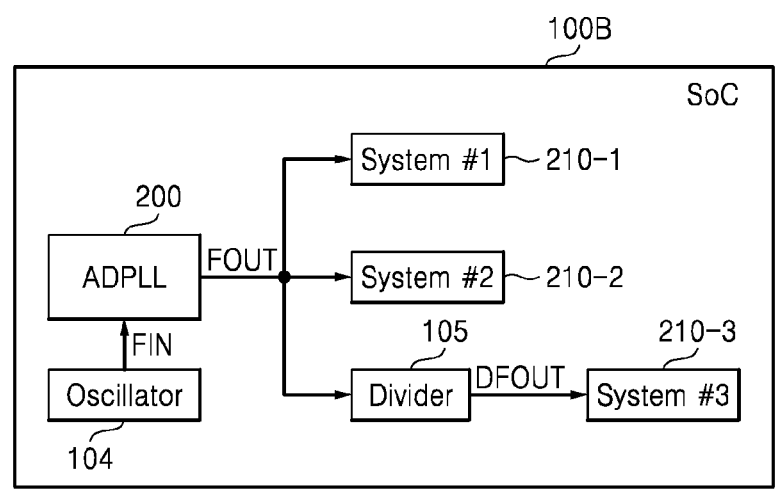
FIG. 2 is a block diagram of an SoC including an ADPLL according to another exemplary embodiment.

FIG. 2 is a block diagram of a SoC including an ADPLL, according to another exemplary embodiment. An SoC 100B includes the ADPLL 200. The structure and the functions of the SoC 100B illustrated in FIG. 2 are substantially the same as those of the SoC 100A illustrated in FIG. 1, with the exception that an oscillator 104 that generates the input clock signal FIN is implemented within the SoC 100B.

Figure 3:
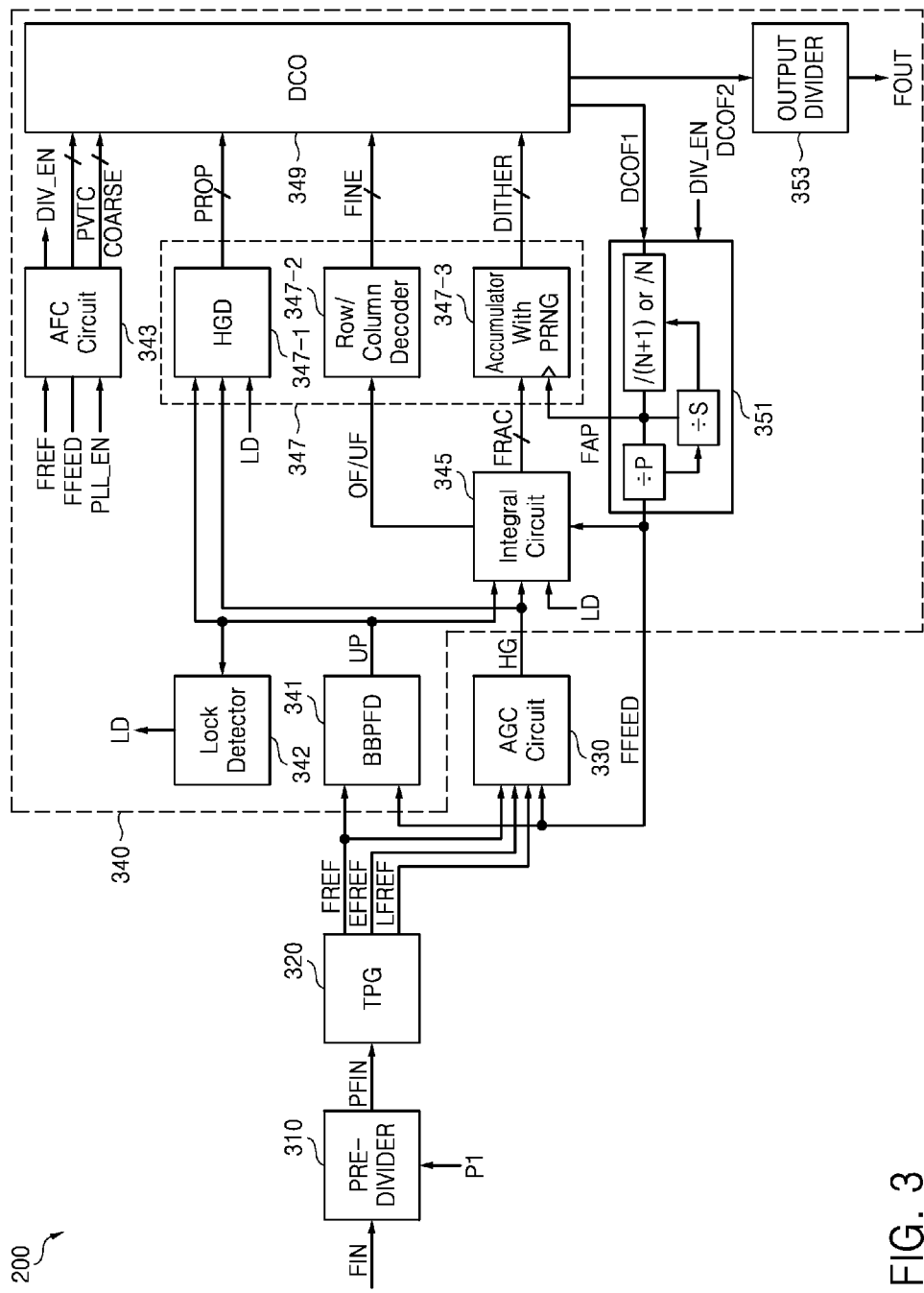
FIG. 3 is a block diagram of the all-digital phase-locked loop (ADPLL) of FIGS. 1 and 2, according to an exemplary embodiment.
Figure 4:
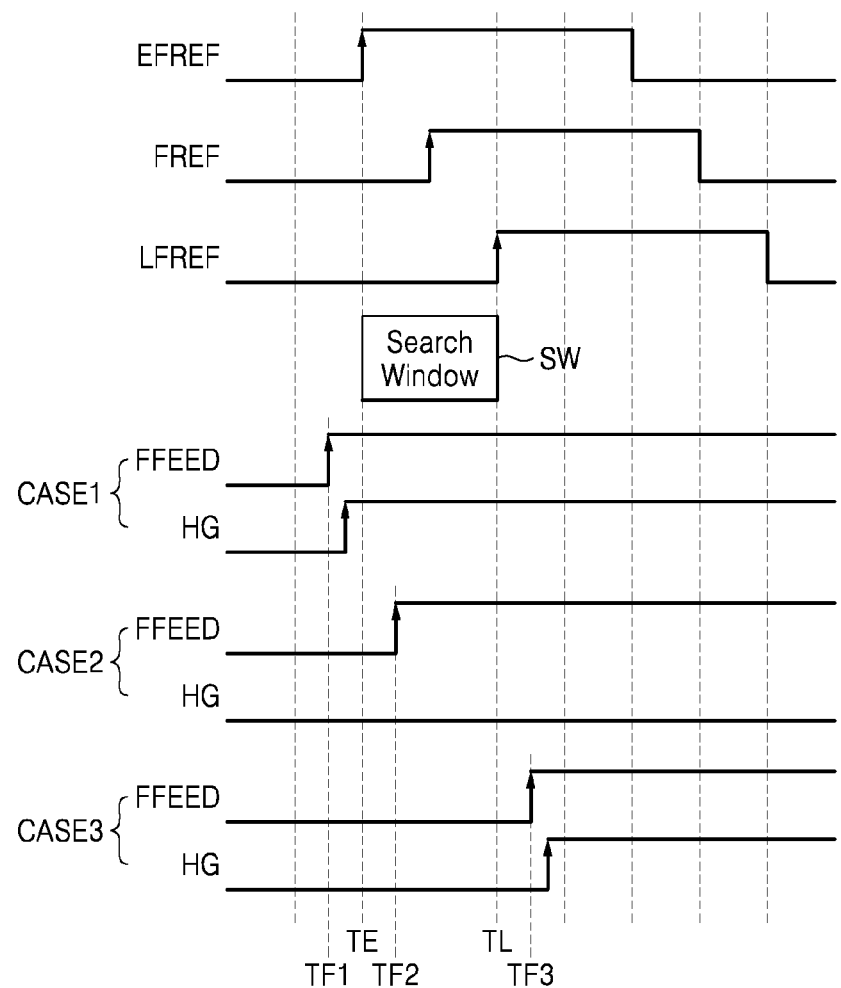
FIG. 4 is a waveform diagram illustrating output signals of a three-phase signal generator (TPG) of the ADPLL illustrated in FIG. 3 to explain the operation of an adaptive gain control (AGC) circuit.

FIG. 3 is a block diagram of the ADPLL of FIGS. 1 and 2, according to an exemplary embodiment. FIG. 4 is a waveform diagram illustrating output signals of a three-phase signal generator (TPG) of the ADPLL illustrated in FIG. 3 to explain the operation of an adaptive gain control (AGC) circuit.

Referring to FIG. 3, the ADPLL 200 includes a pre-divider 310, a three-phase signal generator (TPG) 320, an adaptive gain control (AGC) circuit 330, and a closed-loop bandwidth adjustment circuit 340.

The pre-divider 310 divides the input clock signal FIN by a division factor P1 and generates a P1 frequency-divided clock signal PFIN.

As shown in FIG. 4, the TPG 320 may generate three reference clock signals FREF, EFREF, and LFREF, each having a different phase, using the P1 frequency-divided clock signal PFIN. The TPG 320 performs a function of a reference clock signal generator that generates a plurality of the reference clock signals, including a reference clock signal FREF, an early reference clock signal EFREF, and a late reference clock signal LFREF. Three reference clock signals FREF, EFREF, and LFREF may have the same frequency.

In another exemplary embodiment, the TPG 320 may be replaced with a multi-phase signal generator that generates at least four reference clock signals, each having a different phase.

The AGC circuit 330 performing a function of a detection circuit may detect a phase change or a transition in a feedback signal FFEED of the ADPLL 200 using a search window SW and generate a detection signal, e.g., a high gain enable signal HG, according to the detection result.

As shown in FIG. 4, the search window SW may be defined by a rising edge TE of the early reference clock signal EFREF and a rising edge TL of the late reference clock signal LFREF.

When a phase change point, e.g., a rising edge, TF1 of the feedback signal FFEED leads a phase change point, e.g., rising edge, TE of the early reference clock signal EFREF (CASE1), the AGC circuit 330 generates the high gain enable signal HG at a high level.

When a phase change point TF2 of the feedback signal FFEED is within the search window SW (CASE2), the AGC circuit 330 generates the high gain enable signal HG at a low level.

When a phase change point TF3 of the feedback signal FFEED lags behind the phase change point TL of the late reference clock signal LFREF (CASE3), the AGC circuit 330 generates the high gain enable signal HG at the high level.

The closed-loop bandwidth adjustment circuit 340 may adjust the closed-loop bandwidth of the ADPLL 200 according to the high gain enable signal HG.

For instance, when the phase change of the feedback signal FFEED is detected outside the search window SW as in CASE1 or CASE3 in FIG. 4, that is, when the high gain enable signal HG is activated to the high level, the closed-loop bandwidth adjustment circuit 340 generates the feedback signal FFEED having a first closed-loop bandwidth.

However, when the phase change of the feedback signal FFEED is detected within the search window SW as in CASE2 of FIG. 4, that is, when the high gain enable signal HG is deactivated to the low level, the closed-loop bandwidth adjustment circuit 340 generates the feedback signal FFEED having a second closed-loop bandwidth. The first closed-loop bandwidth may be greater than the second closed-loop bandwidth.

In another exemplary embodiment, the closed-loop bandwidth adjustment circuit 340 may adjust the closed-loop bandwidth of the ADPLL 200 in response to the high gain enable signal HG and a lock signal LD.

For instance, when the high gain enable signal HG is at the high level and the lock signal LD is at a low level, the closed-loop bandwidth adjustment circuit 340 may generate the feedback signal FFEED having a third closed-loop bandwidth.

However, when the high gain enable signal HG is at the low level or the lock signal LD is at a high level, the closed-loop bandwidth adjustment circuit 340 may generate the feedback signal FFEED having a fourth closed-loop bandwidth. The third closed-loop bandwidth may be greater than the fourth closed-loop bandwidth.

The closed-loop bandwidth adjustment circuit 340 may further include a bangbang phase frequency detector (BBPFD) 341, a lock detector 342, an automatic frequency control (AFC) circuit 343, an integral circuit 345, a fine tuning circuit 347, a digitally controlled oscillator (DCO) 349, a main divider 351, and an output divider 353.

The BBPFD 341 compares the phase and frequency of the reference clock signal FREF with the phase and frequency of the feedback signal FFEED and outputs a comparison signal UP according to the comparison result.

Figure 5:
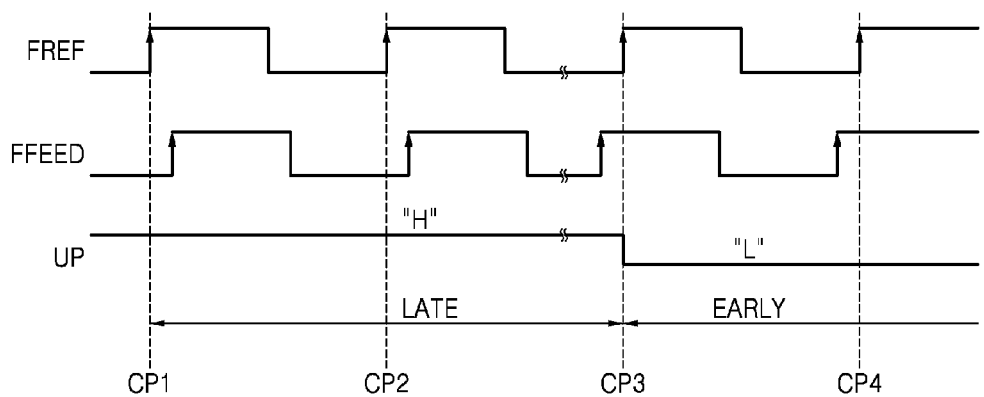
FIG. 5 is a waveform diagram showing an example of the operation of a bangbang phase frequency detector (BBPFD) of the ADPLL illustrated in FIG. 3.

FIG. 5 is a waveform diagram showing the operation of the BBPFD 341 illustrated in FIG. 3.

When the phase (or a phase transition point) of the reference clock signal FREF leads the phase (or a phase transition point) of the feedback signal FFEED at each of comparison points CP1 and CP2 (that is, when the feedback signal FFEED is later than the reference clock signal FREF), the BBPFD 341 outputs the comparison signal UP at a high level to increase the frequency of output clock signals DCOF1 and DCOF2 of the DCO 349. For instance, in a "LATE" state, the BBPFD 341 outputs the comparison signal UP at the high level.

However, when the phase (or phase transition point) of the reference clock signal FREF lags behind the phase (or phase transition point) of the feedback signal FFEED at each of comparison points CP3 and CP4 (that is, when the feedback signal FFEED is earlier than the reference clock signal FREF), the BBPFD 341 outputs the comparison signal UP at a low level to decrease the frequency of output clock signals DCOF1 and DCOF2 of the DCO 349. For instance, in an "EARLY" state, the BBPFD 341 outputs the comparison signal UP at the low level. It is noted that the comparison points CP1 and CP2 illustrated as the "LATE" state, and the comparison points CP3 and CP4 illustrated as the "EARLY" state in FIG. 5 are merely examples. That is, the BBPFD 341 periodically monitors the relationship of the reference clock signal FREF and the feedback signal FFEED, and outputs the comparison signal UP at the high level or low level accordingly.

The lock detector 342 monitors the change in the level of the comparison signal UP and generates the lock signal LD according to the monitoring result.

For instance, the BBPFD 341 outputs the comparison signal UP that remains one of at the high and low level in an unlock state. However, the BBPFD 341 outputs the comparison signal UP that toggles between the high level and the low level in a lock state.

The lock detector 342 may determine the lock or unlock state of the ADPLL 200 based on toggling or non-toggling of the comparison signal UP. For instance, the lock detector 342 generates the lock signal LD at a high level in the lock state and generates the lock signal LD at a low level in the unlock state.

The AFC circuit 343 that is enabled in response to a PLL enable signal PLL_EN generates a divider enable signal DIV_EN in response to a rising edge of the reference clock signal FREF. Accordingly, the main divider 351 generates the feedback signal FFEED in response to the divider enable signal DIV_EN.

In AFC mode, the AFC circuit 343 compares the frequency of the reference clock signal FREF with the frequency of the feedback signal FFEED and generates a first control code PVTC and a second control code COARSE according to the comparison result.

In AFC mode, the pre-divider 310, the TPG 320, the AGC Circuit 330, the BBPFD 341, the Lock Detector 342, the fine tuning circuit 347, the DCO 349, the main divider 351, and the output divider 353 other than the AFC circuit 343 are disabled. Accordingly, the power consumption of the DCO 349 is decreased and the resolution of the DCO 349 is increased, and the phase noise and lock time of the DCO 349 are reduced.

Here, the lock time denotes a time taken for the ADPLL 200 to enter the lock state from the unlock state.

The first control code PVTC includes digital signals for tuning, calibrating, or compensating for process/voltage/temperature (PVT) variation. For instance, the first control code PVTC adjusts the delay of delay cells related with the closed-loop bandwidth of the feedback signal FFEED of the ADPLL 200.

The second control code COARSE includes digital signals for adjusting a voltage or current supplied to the DCO 349 in order to tune, calibrate, or compensate the frequency of the output signals DCOF1 and DCOF2. For instance, the second control code COARSE controls the current of a current source related with the closed-loop bandwidth of the feedback signal FFEED of the ADPLL 200.

In another exemplary embodiment, in AFC mode, the AFC circuit 343 may generate the first control code PVTC and the second control code COARSE at different timings, respectively, or may generate them simultaneously. In yet another exemplary embodiment, the number of bits in the first control code PVTC may be different from the number of bits in the second control code COARSE.

In AFC mode, the AFC circuit 343 may perform two-step frequency tuning.

In order to compensate for the PVT variation of the DCO 349, the first control code PVTC is generated to control the maximum frequency tuning range of the DCO 349 in the first step. The second control code COARSE is generated to control the medium frequency tuning range of the DCO 349 in the second step.

After the two-step frequency tuning is completed, fine control codes PROP, FINE, and DITHER are generated to control the minimum frequency tuning range of the DCO 349 in normal mode. Therefore, the DCO 349 operates at a frequency very close to a target frequency in the early stage of the normal mode.

Figure 6:
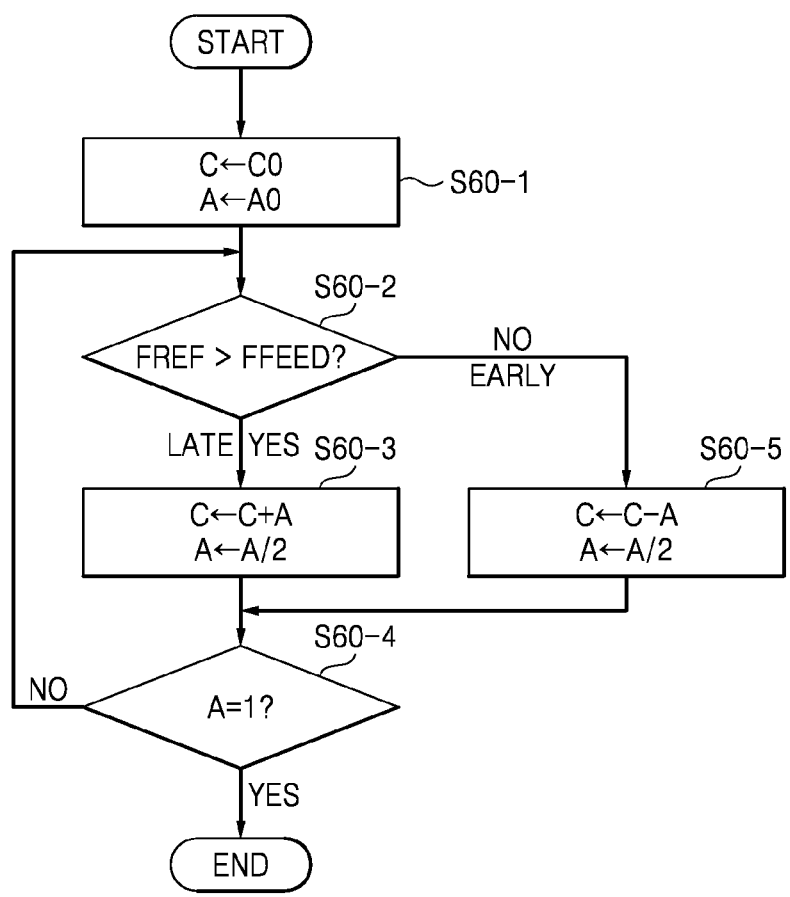
FIG. 6 is a flowchart for explaining the operation of an AFC circuit of the ADPLL illustrated in FIG. 3, according to an exemplary embodiment.
Figure 7:
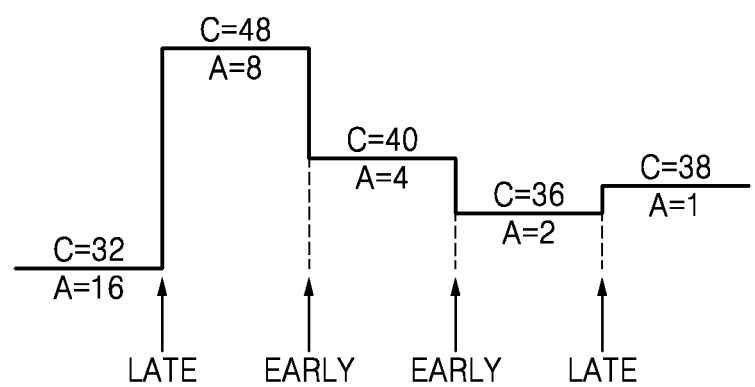
FIG. 7 is a conceptual diagram for explaining the operation of the AFC circuit illustrated in FIG. 6.

FIG. 6 is a flowchart for explaining the operation of the AFC circuit of the ADPLL illustrated in FIG. 3, according to an exemplary embodiment. FIG. 7 is a conceptual diagram for explaining the operation of the AFC circuit 343 illustrated in FIG. 6.

A method of determining bits in the first control code PVTC and/or bits in the second control code COARSE will be conceptually described with reference to FIGS. 6 and 7. For clarity of the description, it is assumed that the first control code PVTC and the second control code COARSE are each 6 bits in length. However, as mentioned above, the number of bits in the first control code PVTC may be different from the number of bits in the second control code COARSE.

In the AFC circuit 343, a first value C is set to a first initial value C0, and a second value A is set to a second initial value A0, in operation S60-1. As an example, the first initial value C0 may be 32=6'b100000, and the second initial value A0 may be 16=6'b010000. The frequency of the reference clock signal FREF is compared with the frequency of the feedback signal FFEED, and it is determined whether the frequency of the reference clock signal FREF is higher than the frequency of the feedback signal FFEED (i.e., FREF>FFEED) in operation S60-2.

When the frequency of the reference clock signal FREF is higher than the frequency of the feedback signal FFEED in operation S60-2, the LATE state is implicated and operation S60-3 is performed. In operation S60-3, the first value C is set to the sum of the first value C and the second value A, and the second value A is set to a value corresponding to half of the second value A. For the example values C and A above, the first value C is set as the sum of C (=32=6'b100000) and A (=16=6'b010000), and thus is set to C (=48=6'b110000), and the second value A is set as half of A (=16=6'b010000) and thus is set to A (=8=6'b001000).

Then, in operation S60-4, it is determined whether the second value A is equal to 1. When the second value A is not 1 in operation S60-4, operation S60-2 is performed. When the second value A is equal to 1, the process ends. In the example, since the second value A (=8=6'b001000) is not 1, operation S60-2 is performed.

Returning to operation S60-2, when the frequency of the reference clock signal FREF is lower than the frequency of the feedback signal FFEED, the EARLY state is implicated, and operation S60-5 is performed.

In operation S60-5, the first value C is set to the difference between the first value C and the second value A, and the second value A is set to a value corresponding to half of the second value A. In the example, the first value C is set as the difference between C (=48=6'b110000) and A (=8=6'b001000), and thus is set to C (=40=6'b101000), and the second value A is set as half of A (=8=6'b001000), and thus is set as A (=4=6'b000100). Since the second value A (=4=6'b000100) is not 1 in operation S60-4, operation S60-2 is repeated.

Upon returning to operation S60-2, when the frequency of the reference clock signal FREF is lower than the frequency of the feedback signal FFEED in operation S60-2, the EARLY state is again implicated and operation S60-5 is repeated.

The first value C is set as the difference between the first value C and the second value A, and the second value A is set to half of the second value in operation S60-5. That is, in the example, C is set to C (=40=6'b101000) minus A (=4=6'b000100), and thus is set to C (=36=6'b100100), and A is set to half of A (=4=6'b000100), and thus is set to A (=2=6'b000010). Since the second value A (=2=6'b000010) is not 1, operation S60-2 is repeated.

When the frequency of the reference clock signal FREF is higher than the frequency of the feedback signal FFEED in operation S60-2, a LATE state is implicated and operation S60-3 is repeated. The first value C is set to the sum of the first value C and the second value A, and the second value A is set to half of the second value A in operation S60-3. Thus, in the example, the first value C is set to C (=36=6'b100100) plus A (=2=6'b000010), and thus is set to C (=38=6'b100110). The second value A is set to half of A (=2=6'b000010), and thus is set to A (=1=6'b000001).

As described above with reference to FIGS. 6 and 7, the AFC circuit 343 may sequentially set bits from a bit following the most significant bit (MSB) to the least significant bit (LSB). In the example, since the second value A (=1=6'b000001) is 1 in operation S60-4, the bits in the first control code PVTC and/or the bits in the second control code COARSE are determined as 6'b100110.

As described above, the AFC circuit 343 may compare the frequency of the reference clock signal FREF with the frequency of the feedback signal FFEED and generate the first control code PVTC and/or the second control code COARSE according to the comparison result.

Therefore, when the DCO 349 and the main divider 351 are designed appropriately, the ADPLL 200 may generate the feedback signal FFEED having a frequency close to the frequency of the reference clock signal FREF.

Referring back to FIG. 3, the integral circuit 345 generates an overflow/underflow signal OF/UF and a fractional code FRAC in response to the lock signal LD, the high gain enable signal HG, and the comparison signal UP.

Figure 8:
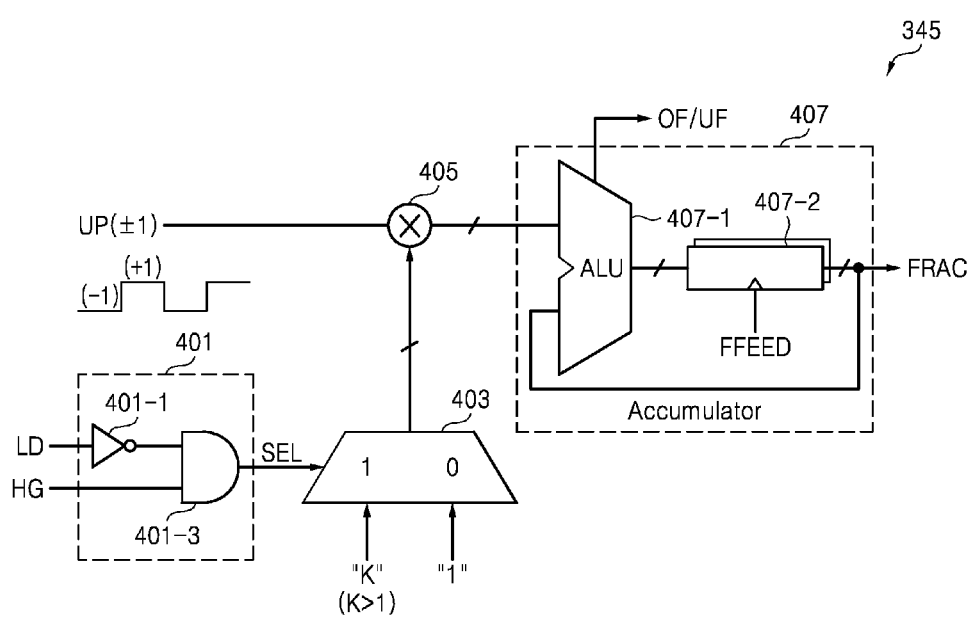
FIG. 8 is a circuit diagram of an integral circuit of the ADPLL illustrated in FIG. 3, according to an exemplary embodiment.

FIG. 8 is a circuit diagram of the integral circuit of the ADPLL illustrated in FIG. 3. Referring to FIG. 8, the integral circuit 345 includes a selection signal generator 401, a selection circuit 403, a multiplier 405, and an accumulator 407.

The selection signal generator 401 generates a selection signal SEL in response to the lock signal LD and the high gain enable signal HG. The selection signal generator 401 includes an inverter 401-1 receiving the lock signal LD and an AND gate 401-3 performing an AND operation on an output signal of the inverter 401-1 and the high gain enable signal HG.

When the lock signal LD is at the low level and the high gain enable signal HG is at the high level, that is, when the ADPLL 200 is in the unlock state and the phase of the feedback signal FFEED makes a transition within the search window SW, the selection signal generator 401 outputs the selection signal SEL at a high level. Accordingly, the selection circuit 403 outputs "K". In otherwise cases, the selection signal generator 401 outputs the selection signal SEL at a low level, and therefore, the selection circuit 403 outputs "1".

The selection circuit 403 outputs "1" or "K" based on the selection signal SEL, where "1" and/or "K" may be signals or bits that represent a binary integer.

The multiplier 405 multiplies the comparison signal UP by a signal output from the selection circuit 403. For instance, when the comparison signal UP at the low level is represented by "−1" and the comparison signal UP at the high level is represented by "+1", the multiplier 405 may output "±1" or "±K" according to the output signal of the selection circuit 403.

The accumulator 407 accumulates a current input value and a previous input value in response to the feedback signal FFEED and generates the overflow bit/underflow bit OF/UF and the fractional code FRAC according to the accumulation result.

The accumulator 407 includes an arithmetic-logic unit (ALU) 407-1 and a plurality of flip-flops 407-2 operating in response to the feedback signal FFEED.

The ALU 407-1 may add output signals of the multiplier 405 and output signals of the flip-flops 407-2 in units of bits and output an addition result to the flip-flops 407-2. In addition, the ALU 407 may output the overflow bit OF or the underflow bit UF, which is generated according to the addition result.

Referring back to FIG. 3, the fine tuning circuit 347 that performs a function of a fine control code generation circuit may finely tune the frequency of the feedback signal FFEED to a target frequency.

In a normal mode, the DCO 349 may control a total capacitance of capacitors related with the closed-loop bandwidth of the ADPLL 200 based on a fine control code. The fine control code includes the third control code PROP, the fourth control code FINE, and the fifth control code DITHER.

As shown in FIG. 3, the fine tuning circuit 347 includes a high gain demodulator (HGD) 347-1, a row/column decoder 347-2, and an accumulator-with-pseudo random number generator (PRNG) 347-3.

The HGD 347-1 generates the third control code PROP in response to the comparison signal UP, the high gain enable signal HG, and the lock signal LD. For instance, when the lock signal LD is at the low level and both the comparison signal UP and the high gain enable signal HG are at the high level, the HGD 347-1 increases the third control code PROP by a first variation.

When the lock signal LD is at the high level or the high gain enable signal HG is at the low level and the comparison signal UP is at the high level, the HGD 347-1 increases the third control code PROP by a second variation. The first variation may be greater than the second variation.

When both the lock signal LD and the comparison signal UP are at the low level and the high gain enable signal HG is at the high level, the HGD 347-1 decreases the third control code PROP by a third variation.

When the lock signal LD is at the high level or the high gain enable signal HG is at the low level and the comparison signal UP is at the low level, the HGD 347-1 decreases the third control code PROP by a fourth variation. The third variation may be greater than the fourth variation.

In another exemplary embodiment, the first variation may be the same as the third variation and the second variation may be the same as the fourth variation.

The row/column decoder 347-2 may generate the fourth control code FINE which increases in response to the overflow bit OF, and which decreases in response to the underflow bit UF.

The accumulator-with-PRNG 347-3 generates the fifth control code DITHER in response to the fractional code FRAC. The accumulator-with-PRNG 347-3 randomizes the fractional code FRAC in response to a clock signal FAP output from the main divider 351 and generates the fifth control code DITHER as a result of the randomization.

According to the fifth control code DITHER, the resolution of the frequency of the DCO clock signals DCOF1 and DCOF2 output from the DCO 349 is improved and a spurious tone of an accumulator (not shown) included in the accumulator-with-PRNG 347-3 is removed.

As for the structure and operation of the accumulator-with-PRNG 347-3, an accumulator-with-PRNG as disclosed in Korean Patent Application No. 10-2012-0007129 filed in Korea on Jan. 25, 2012 and U.S. patent application Ser. No. 13/737,337 filed on Jan. 9, 2013 may be used. The disclosures of Korean Patent Application No. 10-2012-0007129 filed in Korea on Jan. 25, 2012 and U.S. patent application Ser. No. 13/737,337 filed on Jan. 9, 2013, are hereby incorporated by reference in their entirety.

Figure 9:
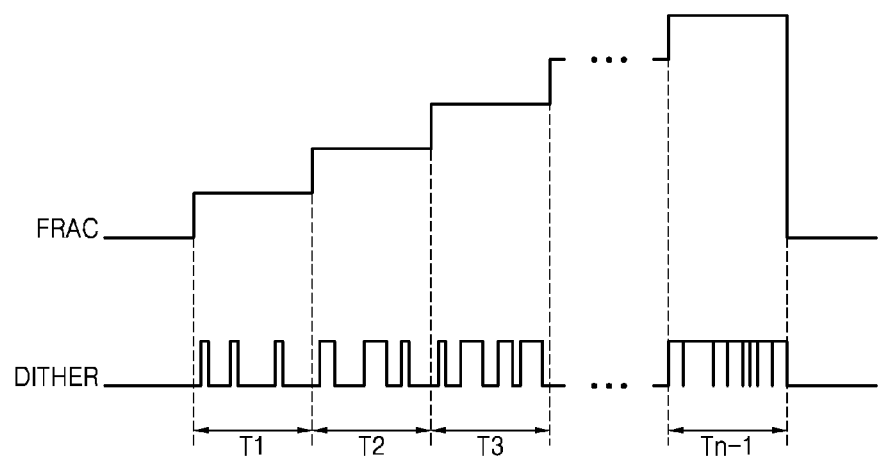
FIG. 9 is a conceptual diagram for explaining the operation of an accumulator-with-pseudo random number generator (PRNG) of the ADPLL illustrated in FIG. 3.

FIG. 9 is a conceptual diagram for explaining the operation of the accumulator-with-PRNG of the ADPLL illustrated in FIG. 3.

Figure 13:
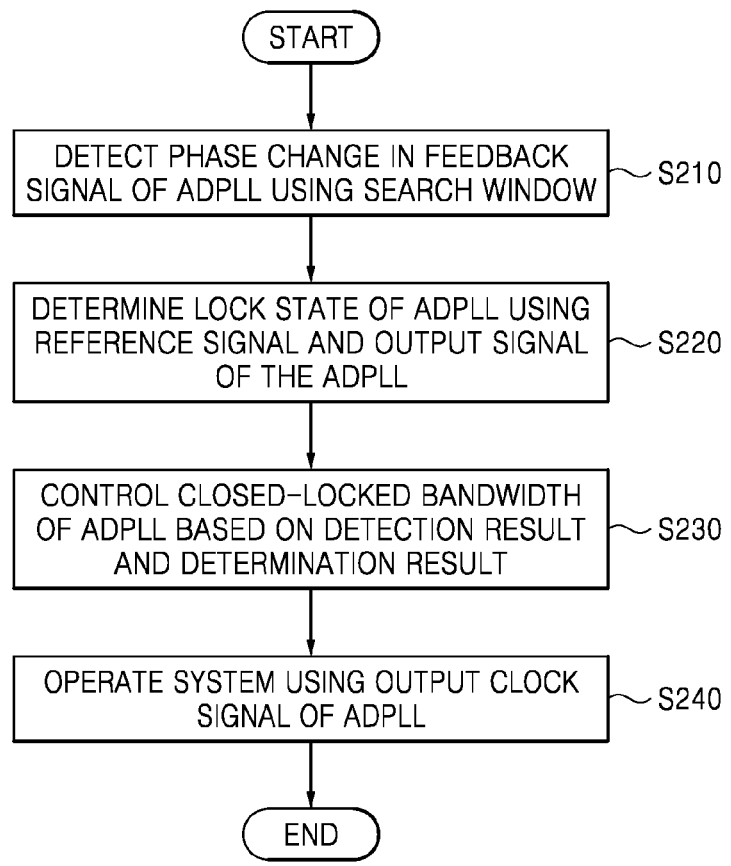
FIG. 13 is a flowchart of a method of operating a system including an ADPLL, according to another exemplary embodiment.

For clarity of the description, it is assumed that the fifth control code DITHER is 1 bit in length. Referring to FIG. 13, when the fractional code FRAC increases, the sum of pulse widths of a signal representing the fifth control code DITHER also increases.

For instance, when the fractional code FRAC is 5'b00000, the signal representing the fifth control code DITHER is at a low level.

When the fractional code FRAC is 5'b00001 in a first section T1, the signal representing the fifth control code DITHER includes at least one pulse and the sum of the pulse width of the at least one pulse is 1/32 of a cycle or period.

When the fractional code FRAC is 5'b00010 in a second section T2, the signal representing the fifth control code DITHER includes at least one pulse and the sum of the pulse width of the at least one pulse is 2/32 of the cycle.

When the fractional code FRAC is 5'b00011 in a third section T3, the signal representing the fifth control code DITHER includes at least one pulse and the sum of the pulse width of the at least one pulse is 3/32 of the cycle.

When the fractional code FRAC is 5'b11111 in an (n−1)-th section Tn−1, the signal representing the fifth control code DITHER includes at least one pulse and the sum of the pulse width of the at least one pulse is 31/32 of the cycle.

Here, the cycle or the period may be a value, e.g., 32, related with the number of bits included in the fractional code FRAC. Moreover, it is noted that only a few pulses are shown in FIG. 9 for clarity of description, and the number of pulses in the time periods, T1, T2, T3, and Tn−1 are not limited.

Figure 10:
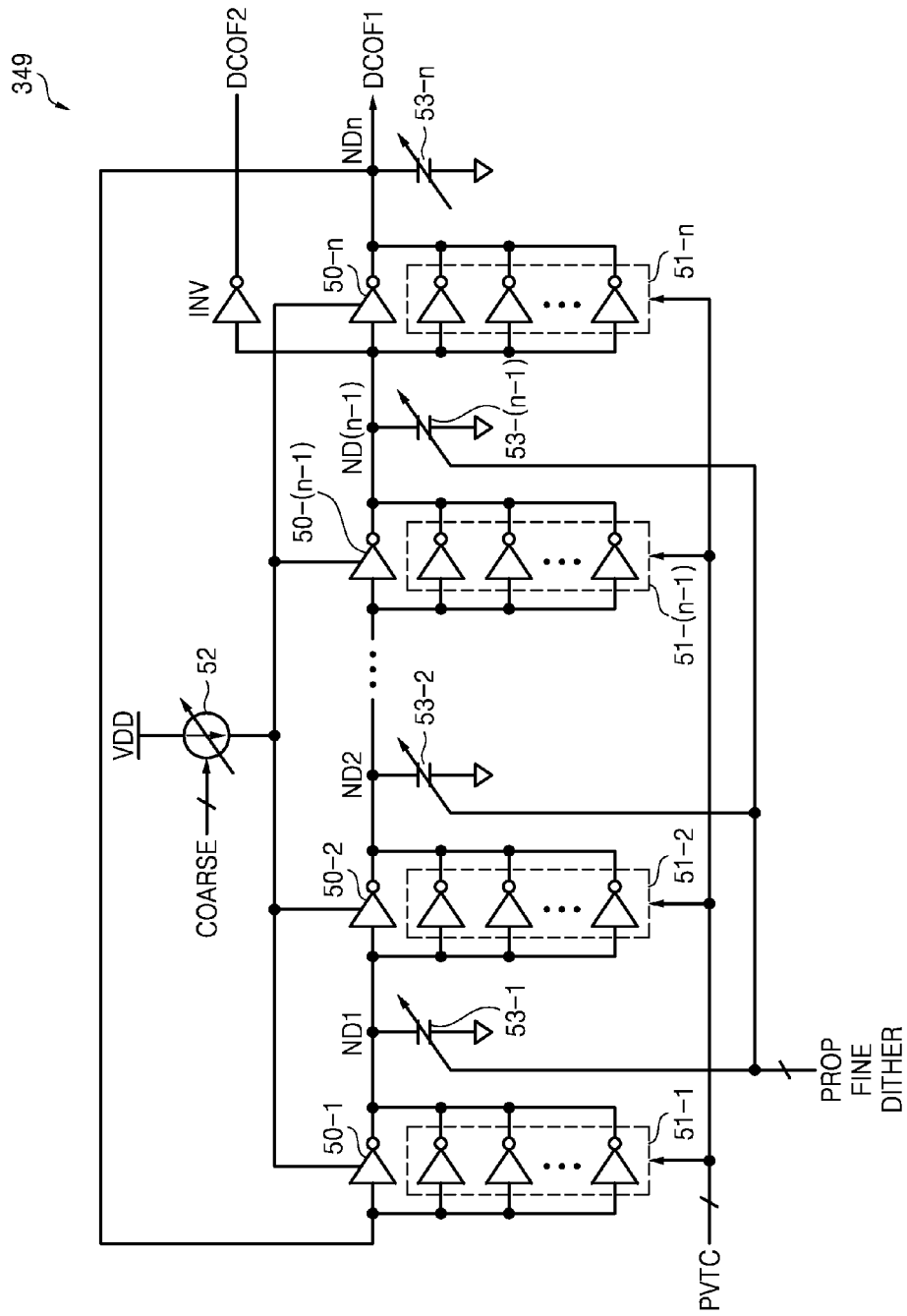
FIG. 10 is a circuit diagram of a digitally controlled oscillator (DCO) of the ADPLL illustrated in FIG. 3, according to an exemplary embodiment.

FIG. 10 is a circuit diagram of the DCO of the ADPLL illustrated in FIG. 3, according to an exemplary embodiment.

Referring to FIGS. 3 and 10, the DCO 349 includes a plurality of inverters 50-1 through 50-n connected in a ring shape, a plurality of inverter blocks 51-1 through 51-n, a current source 52, and a plurality of capacitor bank arrays 53-1 through 53-n, where "n" is an odd number greater than 1.

The inverter blocks 51-1 through 51-n are respectively connected in parallel with the inverters 50-1 through 50-n. The inverter blocks 51-1 through 51-n each may be referred to as a delay cell or a tuning cell. In another exemplary embodiment, an inverter included in each of the inverter blocks 51-1 through 51-n may be referred to as a delay cell or a tuning cell.

Each of the inverter blocks 51-1 through 51-n is enabled or disabled in response to at least one corresponding bit among bits included in the first control code PVTC. Each of the inverter blocks 51-1 through 51-n includes a plurality of inverters connected in parallel with each other. When the number of inverters enabled increases, the driving performance also increases. As a result, the frequency of the DCO clock signals DCOF1 and DCOF2 of the DCO 349 increases.

The first inverter block 51-1 includes at least one inverter connected in parallel to the first inverter 50-1. The at least one inverter is enabled or disabled in response to at least one corresponding bit among the bits in the first control code PVTC.

The second inverter block 51-2 includes at least one inverter connected in parallel to the second inverter 50-2. The at least one inverter is enabled or disabled in response to at least one corresponding bit among the bits in the first control code PVTC.

The n-th inverter block 51-n includes at least one inverter connected in parallel to the n-th inverter 50-n. The at least one inverter is enabled or disabled in response to at least one corresponding bit among the bits in the first control code PVTC.

The frequency of the DCO clock signals DCOF1 and DCOF2 of the DCO 349 may be adjusted based on the number of inverters enabled among the inverters included in each of the inverter blocks 51-1 through 51-n.

The current source 52 may control the amount of current supplied to the inverters 50-1 through 50-n in response to the second control code COARSE. The frequency of the DCO clock signals DCOF1 and DCOF2 generated by the DCO 349 may be adjusted according to the amount of current. The amount of current is related to a power supply voltage VDD. In other words, when the amount of current supplied to the inverters 50-1 through 50-n increases, the frequency of the DCO clock signals DCOF1 and DCOF2 of the DCO 349 also increases.

The capacitor bank arrays 53-1 through 53-n are respectively connected to nodes ND1 through NDn. Each capacitance of the capacitor bank arrays 53-1 through 53-n may be adjusted based on the third control code PROP, the fourth control code FINE, and the fifth control code DITHER. Accordingly, the frequency of the DCO clock signals DCOF1 and DCOF2 of the DCO 349 may be adjusted according to the adjusted capacitance.

In another exemplary embodiment, the first DCO clock signal DCOF1 of the DCO 349 may be related to an output signal of an inverter, for example, the last inverter 50-n, among the inverters 50-1 through 50-n. The second DCO clock signal DCOF2 of the DCO 349 may be related to an output signal of an inverter INV other than the inverters 50-1 through 50-n. In another exemplary embodiment, the first DCO clock signal DCOF1 may be the same as the second DCO clock signal DCOF2.

Figure 11:
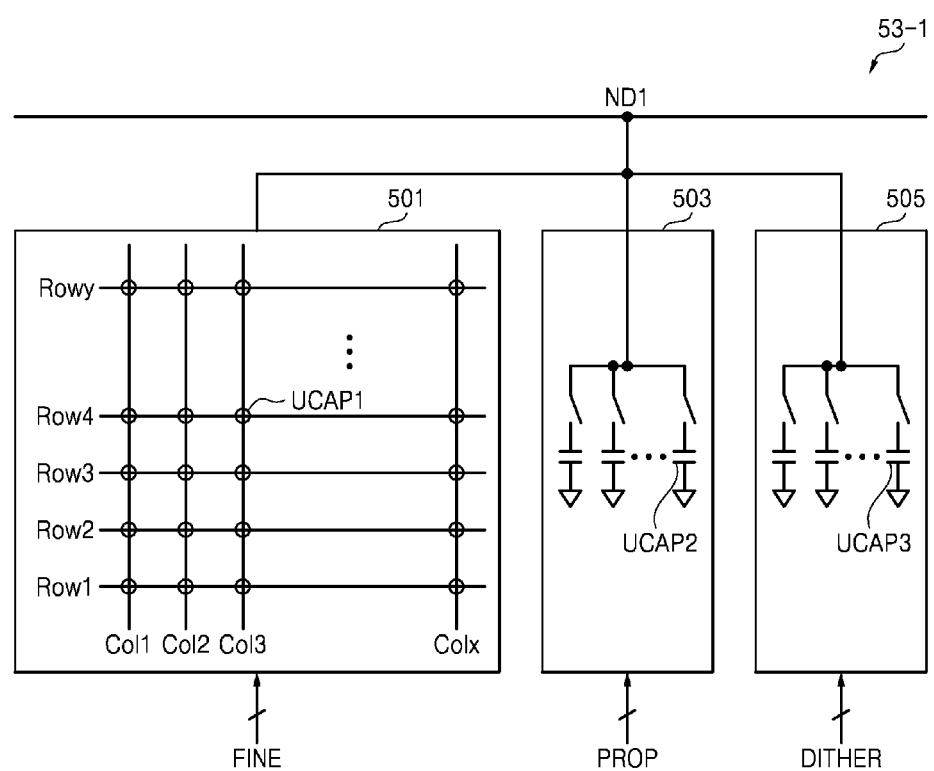
FIG. 11 is a conceptual diagram for explaining the operation of a capacitor bank of the DCO illustrated in FIG. 10, according to an exemplary embodiment.

FIG. 11 is a conceptual diagram for explaining the operation of the capacitor bank 53-1 illustrated in FIG. 10.

Referring to FIGS. 3, 10, and 11, the structure and the operation of the capacitor bank arrays 53-1 through 53-n are the same as one another, and therefore, the structure and the operation of the first capacitor bank array 53-1 only will be described for the sake of convenience of description.

The first capacitor bank array 53-1 includes a first capacitor array 501, a second capacitor array 503, and a third capacitor array 505.

The first capacitor array 501 includes row lines ROW1 through ROWy, column lines COL1 through COLx, and a plurality of first unit capacitors UCAP1 arranged at the intersections of the row lines ROW1 through ROWy and the column lines COL1 through COLx. In other words, the first unit capacitors UCAP1 are arranged in a matrix-like form an ON or OFF state of the first unit capacitors UCAP1 is controlled based on bits in the fourth control code FINE.

Here, the "ON" state indicates an operation in which the total capacitance of the first capacitor array 501 increases and an "OFF" state indicates an operation in which the total capacitance of the first capacitor array 501 decreases.

For instance, whenever the overflow signal OF is received from the row/column decoder 347-2, the number of first unit capacitors UCAP1 turned on increases. Accordingly, the total capacitance of the first capacitor array 501 increases. As a result, the frequency of the DCO clock signals DCOF1 and DCOF2 of the DCO 349 decreases.

However, whenever the underflow bit UF is received from the row/column decoder 347-2, the number of first unit capacitors UCAP1 turned off increases. Accordingly, the total capacitance of the first capacitor array 501 decreases. As a result, the frequency of the DCO clock signals DCOF1 and DCOF2 of the DCO 349 increases. The number of capacitors turned on may be determined by default.

The second capacitor array 503 includes a plurality of second unit capacitors UCAP2. An ON or OFF state of the second unit capacitors UCAP2 is controlled according to bits in the third control code PROP. The third control code PROP may be implemented by a thermometer code.

As described above, the variation of the third control code PROP is determined based on the activation or deactivation of the high gain enable signal HG and the activation or deactivation of the lock signal LD.

For instance, when the high gain enable signal HG is activated to the high level and the lock signal LD is deactivated to the low level, the number of second unit capacitors UCAP2 simultaneously turned ON or OFF according to the level of the comparison signal UP may be B1.

However, when the high gain enable signal HG is deactivated to the low level and the lock signal LD is activated to the high level, the number of second unit capacitors UCAP2 simultaneously turned ON or OFF according to the level of the comparison signal UP may be B2. Here, B1 and B2 are natural numbers and B1 is greater than B2.

The third capacitor array 505 includes one or more capacitors UCAP3. An ON or OFF state of the third unit capacitors UCAP3 is controlled according to each of bits in the fifth control code DITHER. The fifth control code DITHER may include one or more bits.

Returning to FIG. 3, the main divider 351 may be implemented by a dual modulus divider or a dual modulus prescaler. The main divider 351 may generate the clock signal FAP by dividing the frequency of the first DCO clock signal DCOF1 by (N+1) or N and may generate the feedback signal FFEED by dividing the frequency of the clock signal FAP by P. A P frequency-divided clock signal may be divided by S and S frequency-divided clock signal may be used as a selection signal for selecting (N+1) or N as a division factor.

The output divider 353 may generate the output clock signal FOUT by dividing the second DCO clock signal DCOF2 of the DCO 349 by the division factor.

Figure 12:
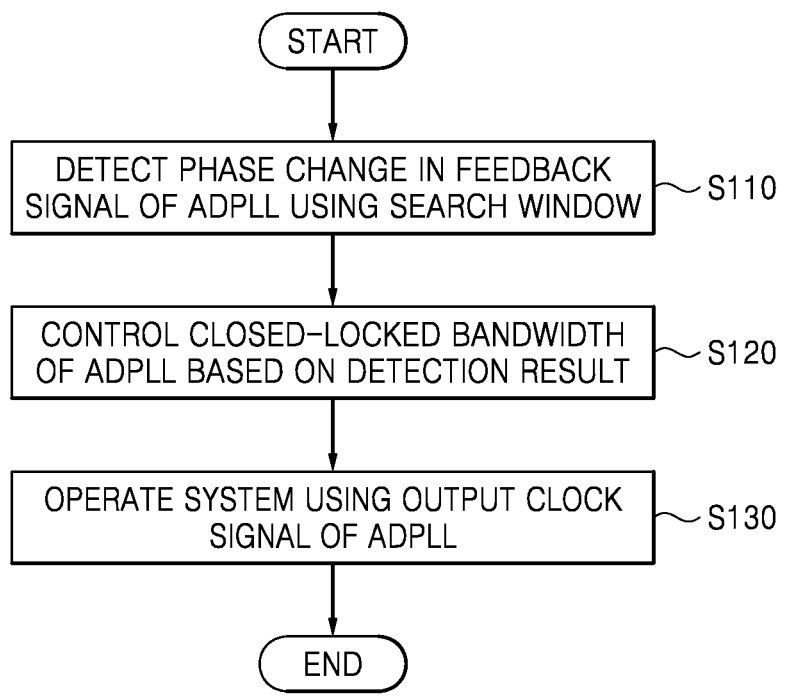
FIG. 12 is a flowchart of a method of operating a system including an ADPLL, according to an exemplary embodiment.

FIG. 12 is a flowchart of a method of operating a system including the ADPLL, according to an exemplary embodiment.

Referring to FIGS. 1 through 12, the ADPLL 200 detects a phase change in the feedback signal FFEED using the search window SW defined by two of the clock signals EFREF, FREF, and LFREF and generates the detection signal HG in operation S110.

The ADPLL 200 controls a closed-loop bandwidth of the ADPLL 200 according to the level of the detection signal HG in operation 5120. The closed-loop bandwidth when the phase change is detected outside the search window SW may be greater than that when the phase change is detected within the search window SW.

The systems 210-1 through 210-3 operates in response to the output clock signal FOUT of the ADPLL 200, which is related to the closed-loop bandwidth that has been controlled, in operation S130.

FIG. 13 is a flowchart of a method of operating a system including the ADPLL, according to another exemplary embodiment.

Referring to FIGS. 1 through 11 and FIG. 13, the ADPLL 200 detects a phase change in the feedback signal FFEED using the search window SW defined by two of the clock signals EFREF, FREF, and LFREF and generates the detection signal HG in operation S210.

The ADPLL 200 determines a lock state of the ADPLL 200 using a reference signal and the output signal of the ADPLL 200. In more detail, the ADPLL 200 compares the phase and frequency of one signal (e.g., FREF) among the clock signals EFREF, FREF, and LFREF with the phase and frequency of the feedback signal FFEED, generates the comparison signal UP, determines a lock state of the ADPLL 200 according to toggling or non-toggling of the comparison signal UP or the number of toggles in the comparison signal UP, and generates the lock signal LD according to the determination result in operation 5220.

The ADPLL 200 controls a closed-loop bandwidth of the ADPLL 200 according to activation or deactivation of the detection signal HG and activation or deactivation of the lock signal LD in operation 5230.

The systems 210-1 through 210-3 operates in response to the output clock signal FOUT of the ADPLL 200, which is related to the closed-loop bandwidth that has been controlled, in operation 5240.

Figure 14:
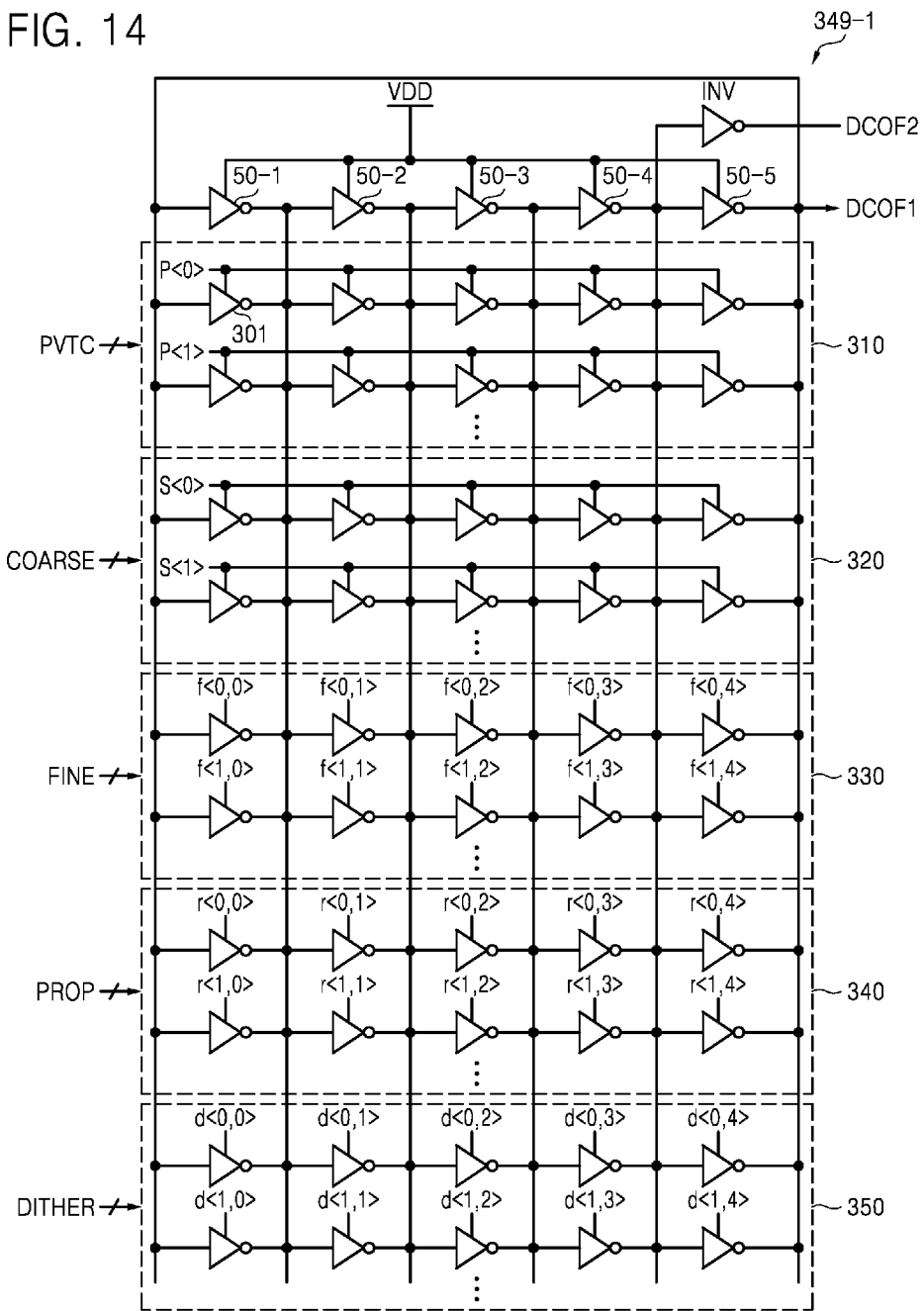
FIG. 14 is a circuit diagram of a DCO, according to another exemplary embodiment.
Figure 15:
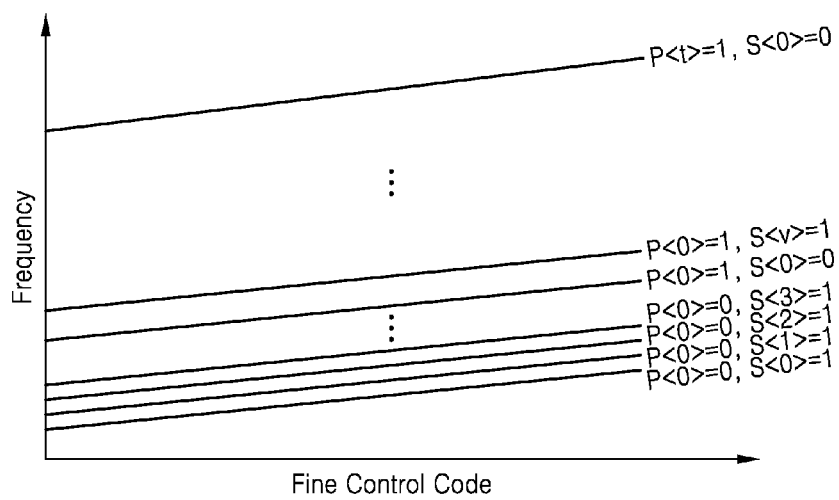
FIG. 15 is a graph illustrating the frequency characteristics of the DCO illustrated in FIG. 14.

FIG. 14 is a circuit diagram of a DCO, according to another exemplary embodiment. FIG. 15 is a graph illustrating the frequency characteristics of the DCO illustrated in FIG. 14.

Referring to FIGS. 3 and 14, a DCO 349-1 includes a plurality of the inverters 50-1 through 50-5 connected to one another in a ring shape and a plurality of gated inverter stages 310 through 350. Each inverter stage 310 through 350 includes a plurality of inverters arranged in one or more rows. There may be an odd number of the inverters 50-1 through 50-5.

The first inverter in each of rows in the gated inverter stages 310 through 350 receives the first DCO clock signal DCOF1. The DCO 349-1 outputs the first DCO clock signal DCOF1 using the inverter 50-5 and outputs the second DCO clock signal DCOF2 using the inverter INV. The inverters 50-1 through 50-5 use a power supply voltage VDD as an operating voltage. The first DCO clock signal DCOF1 is fed back to the inverter 50-1.

The first gated inverter stage 310 includes a plurality of (gated) inverters 301. Each of the inverters 301 is connected in parallel with a corresponding inverter of the inverters 50-1 through 50-5.

At this time, inverters 301 in one row are simultaneously enabled (or turned on) or disabled (or turned off) in response to a corresponding control code. The control code may include one bit or more.

For instance, when a control code p<0> is determined as a combination of bits in the first control code PVTC, inverters 301 in the first row are simultaneously enabled or disabled in response to the control code p<0>.

When a control code p<1> is determined as a combination of bits in the first control code PVTC, inverters 301 in the second row are simultaneously enabled or disabled in response to the control code p<1>.

When a last control code p<t> is determined as a combination of bits in the first control code PVTC, inverters 301 in the last row are simultaneously enabled or disabled in response to the control code p<t>, where "t" is a natural number. For example, when the first control code PVTC is 6 bits in length, the first gated inverter stage 310 includes 64 rows each of which includes a plurality of inverters. It is noted that only two rows of inverters 301 are shown in FIG. 14 for the sake of clarity.

In this case, the control code p<0> selecting the first row may be 6'b0000000; the control code p<1> selecting the second row may be 6'b0000001; and the control code p<63> selecting the 64th row may be 6'b111111. For example, half of the rows in the first gated inverter stage 310 may be initially enabled. Thereafter, the rows in the first gated inverter stage 310 may be selectively enabled using a binary search method.

The second gated inverter stage 320 includes a plurality of (gated) inverters. Each of the inverters is connected in parallel with a corresponding inverter of the inverters 50-1 through 50-5. At this time, inverters in one row are simultaneously enabled (or turned on) or disabled (or turned off) in response to a corresponding control code.

For instance, when a control code s<0> is determined as a combination of bits in the second control code COARSE, inverters in the first row are simultaneously enabled or disabled in response to the control code s<0>.

When a control code s<1> is determined as a combination of bits in the second control code COARSE, inverters in the second row are simultaneously enabled or disabled in response to the control code s<1>.

When a last control code s<v> is determined as a combination of bits in the second control code COARSE, inverters in the last row are simultaneously enabled or disabled in response to the control code s<v>, where "v" is a natural number. For example, when the second control code COARSE is 4 bits in length, the second gated inverter stage 320 includes 16 rows each of which includes a plurality of inverters.

In this case, the control code s<0> selecting the first row may be 4'b00000; the control code s<1> selecting the second row may be 4'b00001; and the control code s<15> selecting the 16th row may be 4'b1111. Half of the rows in the second gated inverter stage 320 may be initially enabled. Thereafter, the rows in the second gated inverter stage 320 may be selectively enabled using the binary search method.

The third gated inverter stage 330 includes a plurality of (gated) inverters. Each of the inverters is connected in parallel with a corresponding inverter of the inverters 50-1 through 50-5. At this time, each of the inverters is enabled (or turned on) or disabled (or turned off) individually in response to a corresponding control code. A control code selecting each of the inverters may be determined as a combination of bits in the fourth control code FINE.

An inverter in the first row and the first column is enabled or disabled in response to a control code f<0,0>. An inverter in the first row and the fifth column is enabled or disabled in response to a control code f<0,4>. An inverter in the second row and the first column is enabled or disabled in response to a control code f<1,0>. An inverter in the second row and the fifth column is enabled or disabled in response to a control code f<1,4>.

For example, half of the inverters in the third gated inverter stage 330 may be initially enabled. Thereafter, the inverters in the third gated inverter stage 330 may be selectively enabled using the binary search method.

The fourth gated inverter stage 340 includes a plurality of (gated) inverters. Each of the inverters is connected in parallel with a corresponding inverter of the inverters 50-1 through 50-5. At this time, each of the inverters is enabled (or turned on) or disabled (or turned off) individually in response to a corresponding control code. A control code selecting each of the inverters may be determined as a combination of bits in the third control code PROP.

An inverter in the first row and the first column is enabled or disabled in response to a control code r<0,0>. An inverter in the first row and the fifth column is enabled or disabled in response to a control code r<0,4>. An inverter in the second row and the first column is enabled or disabled in response to a control code r<1,0>. An inverter in the second row and the fifth column is enabled or disabled in response to a control code r<1,4>.

Half of the inverters in the fourth gated inverter stage 340 may be initially enabled. Thereafter, the inverters in the fourth gated inverter stage 340 may be selectively enabled using the binary search method.

The fifth gated inverter stage 350 includes a plurality of (gated) inverters. Each of the inverters is connected in parallel with a corresponding inverter of the inverters 50-1 through 50-5. At this time, each of the inverters is enabled (or turned on) or disabled (or turned off) individually in response to a corresponding control code. A control code selecting each of the inverters may be determined as a combination of bits in the fifth control code DITHER.

An inverter in the first row and the first column is enabled or disabled in response to a control code d<0,0>. An inverter in the first row and the fifth column is enabled or disabled in response to a control code d<0,4>. An inverter in the second row and the first column is enabled or disabled in response to a control code d<1,0>. An inverter in the second row and the fifth column is enabled or disabled in response to a control code d<1,4>.

For example, half of the inverters in the fifth gated inverter stage 350 may be initially enabled. Thereafter, the inverters in the fifth gated inverter stage 350 may be selectively enabled using the binary search method.

The inverters included in one gated inverter stage may have the same size and inverters respectively included in different gated inverter stages may have different sizes. The frequency resolution of the DCO 349-1 including such inverters increases.

As shown in FIG. 15, the frequency of the DCO 349-1 is determined by the combination of frequency resolutions of the gated inverter stages 310 through 350. The gated inverter stages 310 through 350 may have different frequency resolutions.

For instance, the first gated inverter stage 310 may have higher frequency resolution than the second gated inverter stage 320. The second gated inverter stage 320 may have higher frequency resolution than the fourth gated inverter stage 340. The fourth gated inverter stage 340 may have higher frequency resolution than the third gated inverter stage 330. The third gated inverter stage 330 may have higher frequency resolution than the fifth gated inverter stage 350.

Figure 16:
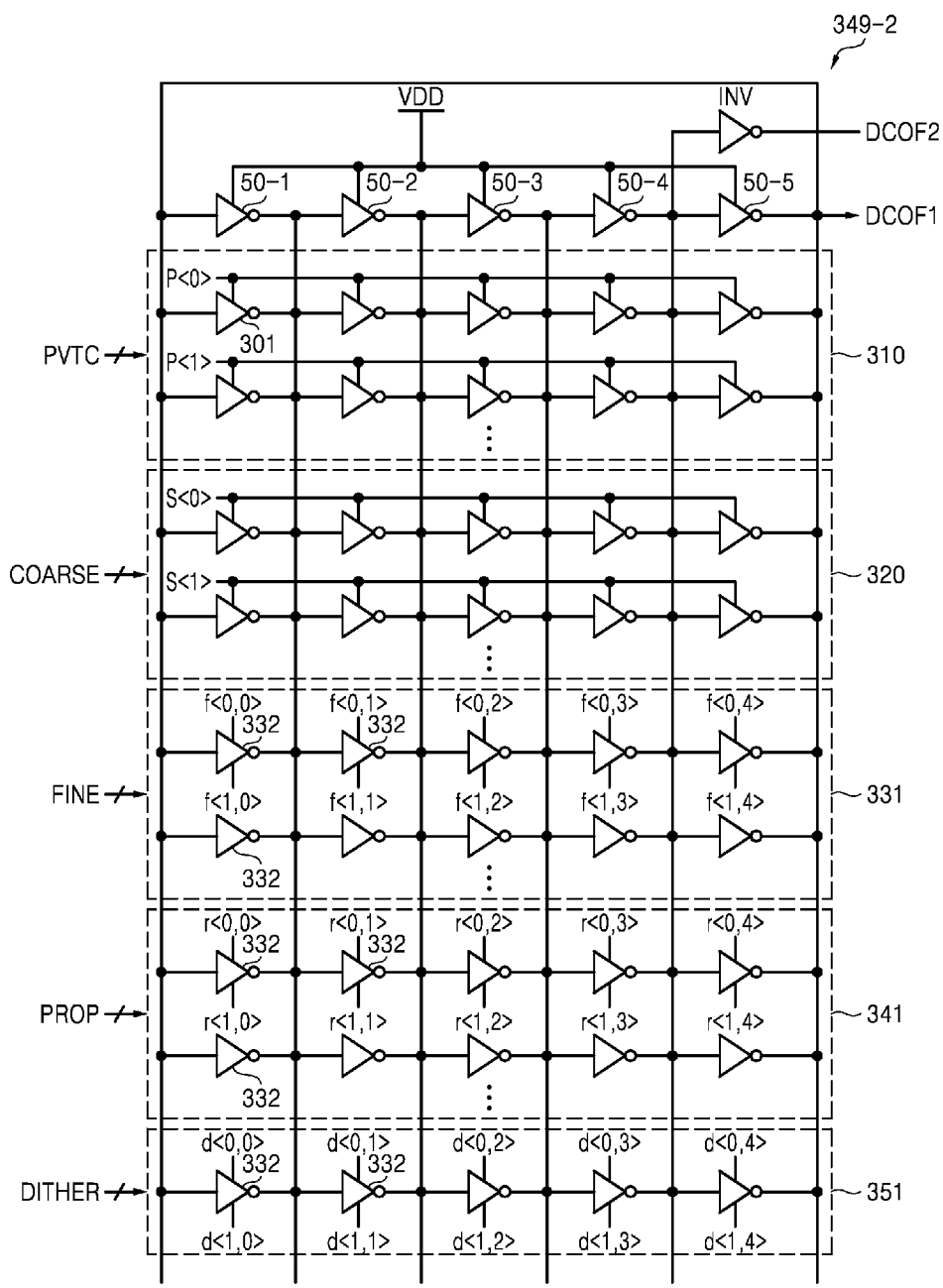
FIG. 16 is a circuit diagram of a DCO, according to yet another exemplary embodiment.
Figure 17:
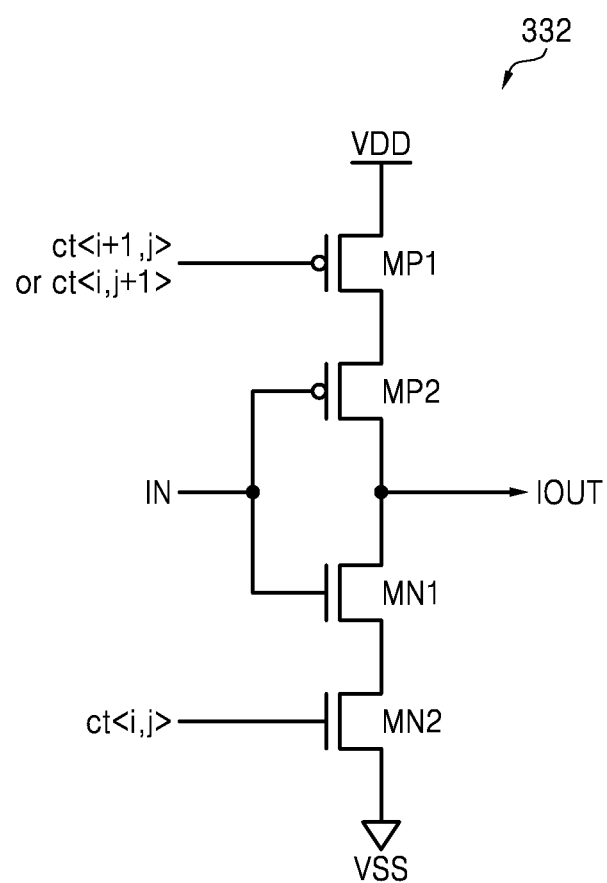
FIG. 17 is a circuit diagram of a gated inverter of the DCO illustrated in FIG. 16.

FIG. 16 is a circuit diagram of a DCO, according to yet another exemplary embodiment. FIG. 17 is a circuit diagram of a gated inverter of the DCO illustrated in FIG. 16, according to an exemplary embodiment.

Referring to FIGS. 3 and 16, a DCO 349-2 includes a plurality of the inverters 50-1 through 50-5 connected to one another in a ring shape and a plurality of gated inverter stages 310, 320, 331, 341, and 351. The structure and operation of the DCO 349-2 are substantially the same as those of the DCO 349-1 except for the structure and operations of the gated inverter stages 331, 341, and 351. Accordingly, only the gated inverter stages 331, 341, and 351 will be described here.

The third gated inverter stage 331 includes a plurality of (gated) inverters 332. Each of the inverters 332 is connected in parallel with a corresponding inverter of the inverters 50-1 through 50-5. At this time, enabling, half-enabling, or full-enabling of each inverter 332 is determined by two corresponding control codes.

Referring to FIG. 17, the inverter 332 includes metal-oxide semiconductor (MOS) transistors MP1, MP2, MN1, and MN2 connected between the power supply voltage VDD and a ground VSS. The MOS transistors MP2 and MN1 invert an input clock signal IN and output an inverted clock signal TOUT. The transistors MP1 and MP2 may be implemented by P-channel MOS (PMOS) transistors, and the transistors MN1 and MN2 may be implemented by N-channel MOS (NMOS) transistors. The transistor MP1 is a pull-up transistor operating in response to a control code ct<i+1,j> or ct<i, j+1>. The transistor MN2 is a pull-down transistor operating in response to a control code ct<i,j>.

The inverter 332 in the first row and the first column is disabled, half enabled, or fully enabled according to the control codes f<0,0> and f<1,0>. The control codes f<0,0> and f<1,0> may be referred to as control codes adjacent in different rows.

When both the control codes f<0,0> and f<1,0> are at a low level, the transistors MP1 and MP2 in the inverter 332 are turned on, and therefore, the inverter 332 is half enabled and performs a pull-up function. When both the control codes f<0,0> and f<1,0> are at a high level, the transistors MN1 and MN2 in the inverter 332 are turned on, and therefore, the inverter 332 is half enabled and performs a pull-down function.

When the control code f<0,0> is at the high level and the control code f<1,0> is at the low level, the transistors MP1, MP2, MN1, and MN2 in the inverter 332 are all turned off, and therefore, the inverter 332 is disabled. When the control code f<0,0> is at the low level and the control code f<1,0> is at the high level, the transistors MP1, MP2, MN1, and MN2 in the inverter 332 are all turned on, and therefore, the inverter 332 is fully enabled.

When the variation of frequency resolution is Δf when the inverter 332 is fully enabled, the variation of frequency resolution is 0.5Δf when the inverter 332 is half enabled. Accordingly, the frequency resolution of the DCO 349-2 having a structure for separately controlling the PMOS transistors MP1 and MP2 and the NMOS transistors MN1 and MN2 increases double as compared to a normal DCO having a structure for controlling the PMOS transistors MP1 and MP2 and the NMOS transistors MN1 and MN2 all at once.

Referring to FIGS. 16 and 17, the control code ct<i,j> is applied to the NMOS transistor MN2 and the control code ct<i+1,j> is applied to the PMOS transistor MP1. Alternatively, the control code ct<i,j> is applied to the PMOS transistor MP1 and the control code ct<i+1,j> is applied to the NMOS transistor MN1. As described above, the control codes ct<i,j> and ct<i+1,j> may be referred to as control codes adjacent in different rows.

The fourth gated inverter stage 341 includes a plurality of (gated) inverters 332. Each of the inverters 332 is connected in parallel with a corresponding inverter of the inverters 50-1 through 50-5. At this time, enabling, half-enabling, or full-enabling of each inverter 332 is determined by two corresponding control codes.

The inverter 332 in the first row and the first column in the fourth gated inverter stage 341 is disabled, half enabled, or fully enabled according to the control codes r<0,0> and r<1, 0>. The inverter 332 in the first row and the fifth column in the fourth gated inverter stage 341 is disabled, half enabled, or fully enabled according to the control codes r<0,4> and r<1, 4>.

The fifth gated inverter stage 351 includes a plurality of (gated) inverters 332. Each of the inverters 332 is connected in parallel with a corresponding inverter of the inverters 50-1 through 50-5. At this time, enabling, half-enabling, or full-enabling of each inverter 332 is determined by two corresponding control codes.

The inverter 332 in the first row and the first column in the fifth gated inverter stage 351 is disabled, half enabled, or fully enabled according to the control codes d<0,0> and d<1,0>. The inverter 332 in the first row and the fifth column in the fifth gated inverter stage 351 is disabled, half enabled, or fully enabled according to the control codes d<0,4> and d<1,4>.

Figure 18:
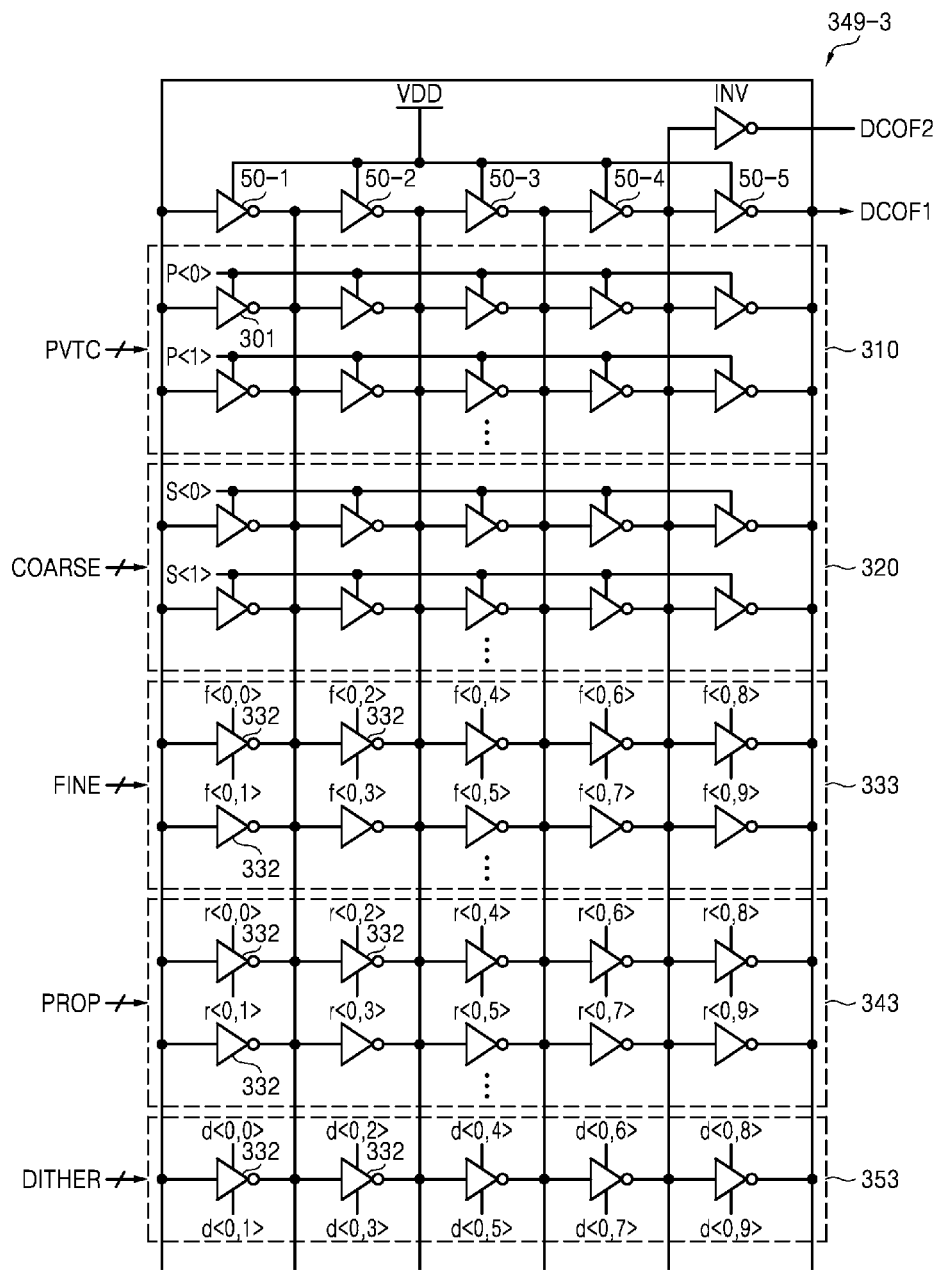
FIG. 18 is a circuit diagram of a DCO, according to yet another exemplary embodiment.

FIG. 18 is a circuit diagram of a DCO, according to yet another exemplary embodiment. The structure and operation of a DCO 349-3 are substantially the same as those of the DCO 349-2 except for the structure and operations of gated inverter stages 333, 343, and 353. Thus, only the gated inverter stages 333, 343, and 353 will be described here.

The third gated inverter stage 333 includes a plurality of (gated) inverters 332. Each of the inverters 332 is connected in parallel with a corresponding inverter of the inverters 50-1 through 50-5. Enabling, half-enabling, or full-enabling of each inverter 332 is determined by two corresponding control codes.

Referring to FIGS. 17 and 18, the control code ct<i,j> is applied to the NMOS transistor MN2 and the control code ct<i,j+1> is applied to the PMOS transistor MP1. Alternatively, the control code ct<i,j> is applied to the PMOS transistor MP1 and the control code ct<i,j+1> is applied to the NMOS transistor MN1. The control codes ct<i,j> and ct<i,j+1> may be referred to as control codes adjacent in different columns.

The inverter 332 in the first row and the first column in the third gated inverter stage 333 is disabled, half enabled, or fully enabled according to the control codes f<0,0> and f<0, 1>. The inverter 332 in the first row and the fifth column in the third gated inverter stage 333 is disabled, half enabled, or fully enabled according to the control codes f<0,8> and f<0, 9>.

The fourth gated inverter stage 343 includes a plurality of (gated) inverters 332. Each of the inverters 332 is connected in parallel with a corresponding inverter of the inverters 50-1 through 50-5. Enabling, half-enabling, or full-enabling of each inverter 332 is determined by two corresponding control codes.

The inverter 332 in the first row and the first column in the fourth gated inverter stage 343 is disabled, half enabled, or fully enabled according to the control codes r<0,0> and r<0, 1>. The inverter 332 in the first row and the fifth column in the fourth gated inverter stage 343 is disabled, half enabled, or fully enabled according to the control codes r<0,8> and r<0, 9>.

The fifth gated inverter stage 353 includes a plurality of (gated) inverters 332. Each of the inverters 332 is connected in parallel with a corresponding inverter of the inverters 50-1 through 50-5. Enabling, half-enabling, or full-enabling of each inverter 332 is determined by two corresponding control codes.

The inverter 332 in the first row and the first column in the fifth gated inverter stage 353 is disabled, half enabled, or fully enabled according to the control codes d<0,0> and d<0,1>. The inverter 332 in the first row and the fifth column in the fifth gated inverter stage 353 is disabled, half enabled, or fully enabled according to the control codes d<0,8> and d<0,9>.

As shown in FIGS. 16 through 18, control codes determining disabling, half-enabling, or full-enabling of each inverter 332 in the gated inverter stages 331, 341, 351, 333, 343, and 353 may vary according to the exemplary embodiment. Inverters included in each of the gated inverter stages 310, 320, 330, 331, 333, 340, 341, 343, 350, 351, and 353 may be referred to as delay cells or tuning cells that control the frequency of the DCOs 349-1, 349-2, and 349-3.

The number of bits included in each of the control codes PVTC, COARSE, FINE, PROP, and DITHER may also be changed variously. The number of bits in the control codes PVTC, COARSE, FINE, PROP, and DITHER has been selected in the exemplary embodiments described above solely for clarity and ease of the description and is not restricted to a value suggested in the exemplary embodiments.

Figure 19:
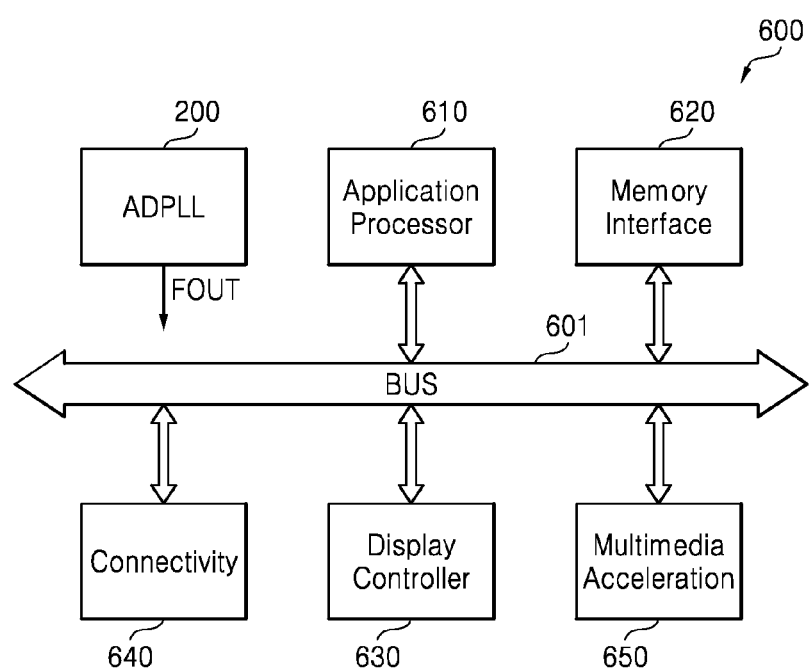
FIG. 19 is a block diagram of a portable electronic device including an ADPLL, according to an exemplary embodiment.

FIG. 19 is a block diagram of a portable electronic device including a ADPLL, according to an exemplary embodiment.

Referring to FIGS. 1 through 19, a portable electronic device 600 includes the ADPLL 200, an application processor 610, a memory interface 620, a display controller 630, connectivity 640, and multimedia acceleration 650, electrically coupled together using a bus 601.

The portable electronic device 600 may be a laptop computer, a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, an e-book, or a mobile internet device (MID), etc.

The ADPLL 200 generates the feedback signal FFEED having an adaptively controlled closed-loop bandwidth and also generates the DCO clock signals DCOF1 and DCOF2 using the feedback signal FFEED.

The application processor 610 may control the memory interface 620, the display controller 630, the connectivity 640, and the multimedia acceleration 650 through the bus 601. The memory interface 620 may include an embedded memory device and also include a memory controller that interfaces with an external memory device.

The display controller 630 may transmit data to be displayed on a display to the display. The connectivity 640 may include general purpose input/output (GPIO) interface, a serial peripheral interface (SPI) bus, and/or a USB on-the-go (OTG), etc. The multimedia acceleration 650 may include camera interface, multi-format codec, video pre/post processor, and/or JPEG, etc.

As described above, according to one or more exemplary embodiments of the inventive concept, an ADPLL adaptively controls a closed-loop bandwidth of the ADPLL according to whether the phase of the feedback signal of the ADPLL changes within a search window, thereby reducing a lock time. When the lock time is reduced, the power consumption of the ADPLL is decreased. In addition, according to one or more exemplary embodiments of the inventive concept, a DCO has finer resolution, reduces the number of tuning cells, and improves jitter performance at low frequency.

While exemplary embodiments have been particularly shown and described, it will be understood by those of ordinary skill in the art that various changes in forms and details may be made therein without departing from the spirit and scope of the inventive concept as defined by the following claims.

What is claimed is:

1. A method of operating an all-digital phase-locked loop (ADPLL), the method comprising:
   detecting a phase change in a feedback signal of the ADPLL using a search window defined by two reference clock signals related to an input clock signal; and
   controlling a closed-loop bandwidth of the ADPLL based on a detection result of the detecting.

2. The method of claim 1, wherein the closed-loop bandwidth when the phase change is detected outside the search window is greater than the closed-loop bandwidth when the phase change is detected within the search window.

3. The method of claim 1, further comprising comparing the feedback signal with a reference clock signal using a bangbang phase frequency detector, wherein the closed-loop bandwidth is controlled based on the detection result and a comparison result of the comparing.

4. The method of claim 3, wherein the closed-loop bandwidth when the phase change is detected outside the search window and the ADPLL is in an unlock state is greater than the closed-loop bandwidth when the phase change is detected within the search window or the ADPLL is in a lock state.

5. The method of claim 1, further comprising:
   generating a reference clock signal, an early reference clock signal, and a late reference clock signal, each having a different phase,
   wherein the search window is set according to an edge of the early reference clock signal and an edge of the late reference clock signal.

6. The method of claim 5, wherein the search window is set as a time from a rising edge of the early reference clock signal to a rising edge of a late reference clock signal.

7. A method of operating a system on chip (SoC) including an all-digital phase-locked loop (ADPLL) and a system, the method comprising:
   detecting whether a phase of a feedback signal of the ADPLL changes within a search window defined by two reference clock signals related to an input clock signal;
   controlling a closed-loop bandwidth of the ADPLL based on a detection result of the detecting; and
   providing an output clock signal of the ADPLL, which is related to a controlled closed-loop bandwidth, to the system.

8. The method of claim 7, wherein the closed-loop bandwidth when the phase changes outside the search window is greater than the closed-loop bandwidth when the phase changes within the search window.

9. The method of claim 7, further comprising:
   comparing the feedback signal with a reference clock signal using a bangbang phase frequency detector; and
   determining a lock or unlock state of the ADPLL based on a comparison result of the comparing,
   wherein the closed-loop bandwidth is controlled based on the detection result and a result of the determining the lock or unlock state.

10. The method of claim 9, wherein the closed-loop bandwidth when the phase changes outside the search window and the ADPLL is in the unlock state is greater than the closed-loop bandwidth when the phase changes within the search window or the ADPLL is in the lock state.

11. An all-digital phase-locked loop (ADPLL) comprising:
   a reference clock signal generator configured to generate a plurality of reference clock signals;
   a detection circuit configured to detect whether a phase of a feedback signal of the ADPLL changes within a search window defined by two of the reference clock signals and to output a detection signal based on a result of the detection; and
   a closed-loop bandwidth adjustment circuit configured to control a closed-loop bandwidth of the ADPLL based on the detection signal.

12. The ADPLL of claim 11, wherein the closed-loop bandwidth when the phase changes outside the search window is greater than the closed-loop bandwidth when the phase changes within the search window.

13. The ADPLL of claim 11, wherein the closed-loop bandwidth adjustment circuit comprises:
   a bangbang phase frequency detector configured to compare a phase and frequency of one of the reference clock signals with a phase and frequency of the feedback signal and to generate a comparison signal based on a result of the comparison; and a lock detector configured to determine a lock or unlock state of the ADPLL based on the comparison signal, and to generate a lock signal indicating the lock or unlock state of the ADPLL, wherein the closed-loop bandwidth adjustment circuit controls the closed-loop bandwidth based on the detection signal and the lock signal.

14. The ADPLL of claim 13, wherein the closed-loop bandwidth when the detection signal is activated and the ADPLL is in the unlock state is greater than the closed-loop bandwidth when the detection signal is deactivated or the ADPLL is in the lock state.

15. The ADPLL of claim 11, wherein the closed-loop bandwidth adjustment circuit comprises:

an automatic frequency control circuit configured to compare a frequency of one of the reference clock signals with a frequency of the feedback signal and to generate a first control code and a second control code based on a result of the comparison; and a digitally controlled oscillator configured to control a delay of delay cells related to the closed-loop bandwidth based on the first control code, and to control a current of a current source related to the closed-loop bandwidth based on the second control code.

16. The ADPLL of claim 15, wherein the automatic frequency control circuit generates the first control code and the second control code at different time points.

17. The ADPLL of claim 15, wherein the closed-loop bandwidth adjustment circuit further comprises:

a bangbang phase frequency detector configured to compare a phase and frequency of the one reference clock signal with a phase and frequency of the feedback signal and to generate a comparison signal according to a result of the comparison;

a lock detector configured to determine a lock or unlock state of the ADPLL based on the comparison signal, and to generate a lock signal indicating the lock or unlock state of the ADPLL; and a fine control code generation circuit configured to generate a fine control code based on the detection signal, the comparison signal, and the lock signal, wherein the digitally controlled oscillator controls a total capacitance of capacitors related to the closed-loop bandwidth based on the fine control code.

18. The ADPLL of claim 17, wherein the closed-loop bandwidth adjustment circuit generates the first control code and the second control code in an automatic frequency control mode of the ADPLL, and generates the fine control code in a normal mode of the ADPLL.

19. A system on chip (SoC) comprising:
an all-digital phase-locked loop (ADPLL); and
an application processor configured to operate in response to a clock signal related to an output clock signal of the ADPLL,
wherein the ADPLL comprises:
a reference clock signal generator configured to generate a plurality of reference clock signals;
a detection circuit configured to detect whether a phase of a feedback signal of the ADPLL changes within a search window defined by two of the reference clock signals; and a closed-loop bandwidth adjustment circuit that is configured to control a closed-loop bandwidth of the ADPLL based on a detection result of the detection by the detection circuit.

20. The SoC of claim 19, wherein the closed-loop bandwidth when the phase changes outside the search window is greater than the closed-loop bandwidth when the phase changes within the search window.

21. The SoC of claim 19, wherein the closed-loop bandwidth adjustment circuit comprises:

a bangbang phase frequency detector configured to compare a phase and frequency of one of the reference clock signals with a phase and frequency of the feedback signal, and to generate a comparison signal according to a result of the comparison; and a lock detector configured to determine a lock or unlock state of the ADPLL based on the comparison signal, and the closed-loop bandwidth adjustment circuit controls the closed-loop bandwidth based on the detection result and a determination result of the lock detector.

22. The SoC of claim 21, wherein the closed-loop bandwidth when the phase changes outside the search window and the ADPLL is in the unlock state is greater than the closed-loop bandwidth when the phase changes within the search window or the ADPLL is in the lock state.

23. A portable electronic device comprising:
the SoC of claim 19; and
a display configured to display data processed by the application processor.

24. The portable electronic device of claim 23, wherein the closed-loop bandwidth when the phase changes outside the search window is greater than the closed-loop bandwidth when the phase changes within the search window.

25. The portable electronic device of claim 23, wherein the closed-loop bandwidth adjustment circuit comprises:

a bangbang phase frequency detector configured to compare a phase and frequency of one of the reference clock signals with a phase and frequency of the feedback signal and to generate a comparison signal according to a result of the comparison; and a lock detector configured to determine a lock or unlock state of the ADPLL based on the comparison signal, and the closed-loop bandwidth adjustment circuit controls the closed-loop bandwidth based on the detection result and a determination result of the lock detector.

26. The portable electronic device of claim 25, wherein the closed-loop bandwidth when the phase changes outside the search window and the ADPLL is in the unlock state is greater than the closed-loop bandwidth when the phase changes within the search window or the ADPLL is in the lock state.

27. An all-digital phase-locked loop (ADPLL) comprising:
a reference clock signal generator configured to generate a reference clock signal, an early reference clock signal, and a late reference clock signal;
an adaptive gain control circuit configured to detect whether a phase of a feedback signal of the ADPLL changes within a search window defined by a relationship of the early reference clock signal and the late reference clock signal, and to output a detection signal based on a result of the detection;
a bangbang phase frequency detector configured to compare a phase and frequency of the reference clock signal with a phase and frequency of the feedback signal generated based on an output clock signal, and to generate a comparison signal based on a result of the comparison;

a lock detector configured to determine a state of the ADPLL as locked or unlocked based on the comparison signal, and to generate a lock signal indicating the state of the ADPLL;

an automatic frequency control circuit configured to compare a frequency of the reference clock signal with a frequency of the feedback signal, and to generate a first control code and a second control code based on a result of the comparison; and a digitally controlled oscillator that comprises a plurality of delay elements and a plurality of capacitive elements, wherein the digitally controlled oscillator is configured to generate and output the output clock signal by controlling the delay elements and the capacitive elements based on the first control code, the second control code, the detection signal, the comparison signal, and the lock signal.

28. The ADPLL of claim 27, wherein the feedback signal has a closed-loop bandwidth, when the adaptive gain control circuit detects that the phase of the feedback signal changes within the search window, the closed-loop bandwidth is controlled to be a first bandwidth, and when the adaptive gain control circuit detects the phase of the feedback signal changes outside the search window, the closed-loop bandwidth is controlled to be a second bandwidth, the second bandwidth being greater than the first bandwidth.

* * * * *